US011180847B2

(12) United States Patent
Wu et al.

(10) Patent No.: US 11,180,847 B2
(45) Date of Patent: Nov. 23, 2021

(54) ATOMIC LAYER DEPOSITION COATINGS FOR HIGH TEMPERATURE CERAMIC COMPONENTS

(71) Applicant: Applied Materials, Inc., Santa Clara, CA (US)

(72) Inventors: Xiaowei Wu, San Jose, CA (US); Jennifer Y. Sun, Mountain View, CA (US); Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 149 days.

(21) Appl. No.: 16/211,335

(22) Filed: Dec. 6, 2018

(65) Prior Publication Data

US 2020/0181771 A1 Jun. 11, 2020

(51) Int. Cl.
*C23C 16/40* (2006.01)
*C23C 16/455* (2006.01)

(52) U.S. Cl.
CPC ........ *C23C 16/40* (2013.01); *C23C 16/45553* (2013.01)

(58) Field of Classification Search
CPC .................................................. C23C 16/405
See application file for complete search history.

(56) References Cited

U.S. PATENT DOCUMENTS

| | | | |
|---|---|---|---|
| 5,630,314 A | 5/1997 | Kojima et al. | |
| 5,805,973 A | 9/1998 | Coffinberry et al. | |
| 5,840,434 A | 11/1998 | Kojima et al. | |
| 6,139,983 A | 10/2000 | Ohashi et al. | |
| 6,454,992 B1 * | 9/2002 | Hebsur | C22C 1/1084 419/32 |
| 6,548,424 B2 | 4/2003 | Putkonen | |
| 6,632,549 B1 | 10/2003 | Ohashi et al. | |
| 6,641,941 B2 | 11/2003 | Yamada et al. | |
| 6,685,991 B2 | 2/2004 | Wataya et al. | |
| 6,777,353 B2 | 8/2004 | Putkonen | |
| 6,858,332 B2 | 2/2005 | Yamada | |
| 6,858,546 B2 | 2/2005 | Niinisto et al. | |
| 6,916,534 B2 | 7/2005 | Wataya et al. | |

(Continued)

FOREIGN PATENT DOCUMENTS

| | | |
|---|---|---|
| CN | 105225997 | 1/2016 |
| JP | H03115535 | 5/1991 |

(Continued)

OTHER PUBLICATIONS

International Search Report and Written Opinion for International Application No. PCT/US2019/064539 dated Mar. 27, 2020, 14 pages.

(Continued)

*Primary Examiner* — Ian A Rummel
(74) *Attorney, Agent, or Firm* — Lowenstein Sandler LLP

(57) ABSTRACT

Certain embodiments of the present disclosure relate to coated articles and methods of coating articles. In one embodiment, a coated article comprises an article adapted for use in a processing chamber, and a coating formed on exterior and interior surfaces of the article. In one embodiment, the coating comprises a rare earth metal-containing ceramic, and the coating is substantially uniform, conformal, and porosity-free.

7 Claims, 9 Drawing Sheets

(56) References Cited

U.S. PATENT DOCUMENTS

| | | |
|---|---|---|
| 7,138,192 B2 | 11/2006 | Yamada et al. |
| 7,351,658 B2 | 4/2008 | Putkonen |
| 7,384,696 B2 | 6/2008 | Hayasaki et al. |
| 7,498,272 B2 | 3/2009 | Niinisto et al. |
| 7,560,376 B2 | 7/2009 | Escher et al. |
| 7,569,280 B2 | 8/2009 | Hayasaki et al. |
| 7,696,117 B2 | 4/2010 | Sun et al. |
| 7,754,621 B2 | 7/2010 | Putkonen |
| 7,780,786 B2 | 8/2010 | Mitsuhashi et al. |
| 7,968,205 B2 | 6/2011 | Nakano et al. |
| 7,998,883 B2 | 8/2011 | Putkonen |
| 8,399,862 B2 | 3/2013 | Ohmi et al. |
| 8,619,406 B2 | 12/2013 | Cho et al. |
| 8,858,745 B2 | 10/2014 | Sun et al. |
| 8,916,021 B2 | 12/2014 | Sun et al. |
| 9,012,030 B2 | 4/2015 | Han et al. |
| 9,090,046 B2 | 7/2015 | Sun et al. |
| 9,343,289 B2 | 5/2016 | Sun et al. |
| 9,394,615 B2 | 7/2016 | Sun et al. |
| 9,440,886 B2 | 9/2016 | Sun et al. |
| 9,551,070 B2 | 1/2017 | Chang et al. |
| 9,617,188 B2 | 4/2017 | Sun et al. |
| 9,617,633 B2 | 4/2017 | He et al. |
| 9,633,884 B2 | 4/2017 | He et al. |
| 2002/0177001 A1 | 11/2002 | Harada et al. |
| 2002/0187327 A1* | 12/2002 | Nagaraj ............... C23C 16/045 428/220 |
| 2003/0029563 A1 | 2/2003 | Kaushal et al. |
| 2003/0051811 A1 | 3/2003 | Uchimaru et al. |
| 2004/0023811 A1 | 2/2004 | Iijima |
| 2004/0170521 A1 | 9/2004 | Stamm |
| 2005/0227118 A1 | 10/2005 | Uchimaru et al. |
| 2006/0037536 A1 | 2/2006 | Kobayashi et al. |
| 2006/0073354 A1 | 4/2006 | Watanabe et al. |
| 2008/0066647 A1 | 3/2008 | Harada et al. |
| 2008/0213496 A1 | 9/2008 | Sun et al. |
| 2008/0264565 A1 | 10/2008 | Sun et al. |
| 2009/0194233 A1 | 8/2009 | Tamura et al. |
| 2010/0119843 A1 | 5/2010 | Sun et al. |
| 2010/0119844 A1 | 5/2010 | Sun et al. |
| 2010/0129670 A1 | 5/2010 | Sun et al. |
| 2010/0323124 A1 | 12/2010 | Vartabedian et al. |
| 2011/0091700 A1 | 4/2011 | Simpson |
| 2011/0165328 A1 | 7/2011 | Clark |
| 2012/0135155 A1 | 5/2012 | Han et al. |
| 2012/0138472 A1 | 6/2012 | Han et al. |
| 2012/0196139 A1 | 8/2012 | Petorak et al. |
| 2012/0206545 A1 | 8/2012 | Kato et al. |
| 2013/0052814 A1 | 2/2013 | Clark |
| 2013/0154059 A1 | 6/2013 | Ohmi et al. |
| 2014/0116338 A1 | 5/2014 | He et al. |
| 2014/0120312 A1 | 5/2014 | He et al. |
| 2015/0004418 A1 | 1/2015 | Sun et al. |
| 2015/0021324 A1 | 1/2015 | Sun et al. |
| 2015/0024155 A1 | 1/2015 | Sun et al. |
| 2015/0061237 A1 | 3/2015 | Sun et al. |
| 2015/0064450 A1 | 3/2015 | Sun et al. |
| 2015/0147562 A1 | 5/2015 | Sambasivan et al. |
| 2015/0152540 A1 | 6/2015 | Sato et al. |
| 2015/0158775 A1 | 6/2015 | Sun et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329955 A1 | 11/2015 | Sun et al. |
| 2016/0079040 A1 | 3/2016 | Park et al. |
| 2016/0181627 A1 | 6/2016 | Roeder et al. |
| 2016/0211121 A1 | 7/2016 | Sun et al. |
| 2016/0273095 A1 | 9/2016 | Lin et al. |
| 2016/0312351 A1 | 10/2016 | Liu et al. |
| 2016/0326625 A1 | 11/2016 | Sun et al. |
| 2016/0326626 A1 | 11/2016 | Sun et al. |
| 2016/0336210 A1 | 11/2016 | Cooke et al. |
| 2016/0375515 A1 | 12/2016 | Xu et al. |
| 2016/0379806 A1 | 12/2016 | Xu et al. |
| 2017/0022595 A1 | 1/2017 | Sato et al. |
| 2017/0110293 A1 | 4/2017 | Sun et al. |
| 2017/0140969 A1 | 5/2017 | Kuo et al. |
| 2018/0044800 A1 | 2/2018 | Hendrix et al. |
| 2018/0240648 A1 | 8/2018 | Wu et al. |
| 2018/0330923 A1 | 11/2018 | Tran et al. |

FOREIGN PATENT DOCUMENTS

| | | |
|---|---|---|
| JP | 2004335151 | 11/2004 |
| JP | 2006082474 | 3/2006 |
| JP | 2007131951 | 5/2007 |
| JP | 2007217782 | 8/2007 |
| JP | 2012166363 | 9/2012 |
| KR | 10-2008-0005047 | 1/2008 |
| KR | 10-2016-0145816 | 12/2016 |
| KR | 20170044396 | 4/2017 |
| WO | 2013032260 | 3/2013 |
| WO | 2015120265 | 8/2015 |
| WO | 2015164638 | 10/2015 |
| WO | 2017087474 | 5/2017 |

OTHER PUBLICATIONS

Rowland, J.C. "Atomic Layer Depositions of the Al2O3-Y2O3 Pseudo-Binary System", Doctoral Disertation, University of Florida, ProQuest LLC, 2010, pp. 1-106.

International Search Report and Written Opinion for International Application No. PCT/US2018/046755 dated Dec. 17, 2018, 11 pgs.

Johansson, et al., "Atomic Layer Deposition Process for Barrier Applications of Flexible Packaging," 33 pgs.

Pilvi, et al., "ALD of YF3 Thin Films from TIF4 and Y(thd)3 Precursors," Chemical Vapor Deposition, 2009, pp. 27-32, vol. 15, Wiley-VCH.

Putkonen, et al., "Low-Temperature ALE Deposition of Y2O3 Thin Films from B-Diketonate Precursors**," Chemical Vapor Deposition, 2001, pp. 44-50, vol. 7, No. 1, Wiley-VCH.

Rönn, J., "Fabrication and characterization of atomic-layer deposited Er2O3 for optical amplifier devices," Aalto University School of Electrical Engineering, Dec. 1, 2014, 71 pgs.

Tamm, et al., "Atomic layer deposition and characterization of zirconium oxide-erbium oxide nanolaminates," Thin Solid Films, 2010, pp. 666-673, vol. 510, Elsevier.

* cited by examiner

ATOMIC LAYER DEPOSITION COATINGS FOR HIGH TEMPERATURE CERAMIC COMPONENTS

TECHNICAL FIELD

Embodiments of the disclosure relate to articles, coated chamber components, and methods of coating chamber components with a ceramic coating. The ceramic coating can include a rare earth metal-containing layer that coats all surfaces of a component (e.g., a high temperature heater or electrostatic chuck). The ceramic coating may be formed using a non-line of sight technique such as atomic layer deposition (ALD).

BACKGROUND

Various semiconductor manufacturing processes use high temperatures, high energy plasma, a mixture of corrosive gases, high stress, and combinations thereof. These extreme conditions often result in the erosion of chamber components and the generation of particle contaminants.

Protective coatings are typically deposited on chamber components by a variety of methods, such as thermal spray, sputtering, plasma spray or evaporation techniques. These techniques generally cannot deposit conformal, uniform coatings onto complex topographical features of a component, which imposes design constraints on the shape complexity of such components. Additionally, these techniques are generally not suitable for coating heater components without noticeably impacting the performance of the heater, as relatively thick coatings would be used to achieve the same level of protection for the heater as that provided by thinner, lower-defect density films.

SUMMARY

Described in embodiments herein are atomic layer deposition coatings for high temperature articles. In one aspect, a coated article comprises an article adapted for use in a processing chamber, wherein the article comprises an exterior surface and an interior channel comprising an interior surface that is inaccessible to line-of-sight deposition processes. The coated article further comprises a coating formed on the exterior surface and the interior surface of the article, the coating comprising a rare earth metal-containing ceramic selected from a group consisting of $Y_2O_3$, YZrO, $Y_xZr_yO_z$, YZrOF, $Y_3Al_5O_{12}$, $Y_4Al_2O_9$, $YF_3$, $Y_xO_yF_z$, YOF, $Er_2O_3$, $Er_3Al_5O_{12}$, $ErF_3$, $E_xO_yF_z$, ErOF, $La_2O_3$, $Lu_2O_3$, $Sc_2O_3$, $ScF_3$, ScOF, $Gd_2O_3$, $Sm_2O_3$, $Dy_2O_3$, and combinations thereof. In some embodiments, the coating is substantially uniform, conformal, and porosity-free.

In another aspect, a coated article comprises: an article adapted for use in a processing chamber; an amorphous carbon adhesion layer formed on the article; and a coating formed on the amorphous carbon adhesion layer, the coating comprising a rare earth metal-containing ceramic selected from a group consisting of $Y_2O_3$, YZrO, $Y_xZr_yO_z$, YZrOF, $Y_3Al_5O_{12}$, $Y_4Al_2O_9$, $YF_3$, $Y_xO_yF_z$, YOF, $Er_2O_3$, $Er_3Al_5O_{12}$, $ErF_3$, $E_xO_yF_z$, ErOF, $La_2O_3$, $Lu_2O_3$, $Sc_2O_3$, $ScF_3$, ScOF, $Gd_2O_3$, $Sm_2O_3$, $Dy_2O_3$, and combinations thereof. In some embodiments, the coating is substantially uniform, conformal, and porosity-free.

In another aspect, a method of forming a coated article comprises: providing an article adapted for use in a processing chamber, the article having a first coefficient of thermal expansion; selecting a molar ratio of a first rare earth metal-containing ceramic compound to a second rare earth metal-containing ceramic compound that, when a ceramic coating comprising the first and second rare earth metal-containing ceramic compounds in the selected molar ratio is deposited onto a surface of the article by atomic layer deposition, results in the ceramic coating having a second coefficient of thermal expansion that is within 10% of the first coefficient of thermal expansion; and performing atomic layer deposition to deposit the ceramic coating on the surface of the article.

BRIEF DESCRIPTION OF THE DRAWINGS

The present disclosure is illustrated by way of example, and not by way of limitation, in the figures of the accompanying drawings in which like references indicate similar elements.

DETAILED DESCRIPTION

Figure 1:
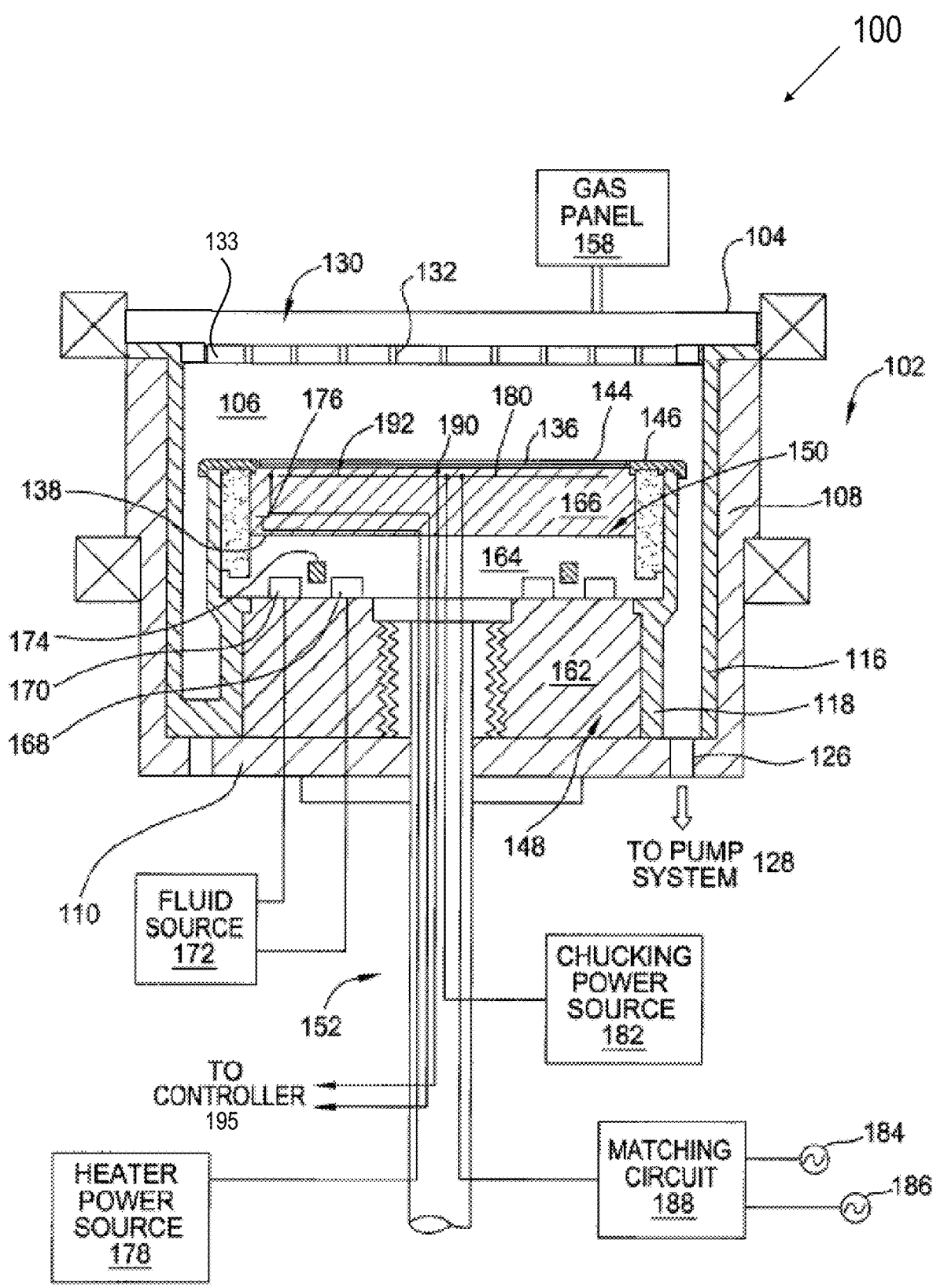
FIG. 1 depicts a sectional view of a processing chamber.

Embodiments described herein cover coated articles and methods where a coating is deposited onto an article. The coating may be a rare earth metal-containing layer (e.g., a yttrium-containing oxide layer or a yttrium-containing fluoride layer). The coating may alternatively be a multi-layer coating that includes one or more adhesion layers and one or more ceramic layers. The deposition process may be a non-line of sight process such as an atomic layer deposition (ALD) process.

Existing ceramic heaters and coating methods have several disadvantages. For example, high sputter yield and erosion rate typically results when the heater is exposed to plasma, for example, when the heater is formed from bulk ceramic AlN, $Al_2O_3$, or SiC-coated graphite. SiC and TaC coated graphite heaters, for example, are incompatible with fluorine-containing chemistry. Plasma-sprayed and SiC-coated graphite heaters are not conformal, which imposes design constraints on their shape complexity. Moreover, the coefficient of thermal expansion (CTE) is difficult to tune for existing heater coatings, limiting their application on substrates with different CTE at high temperature, and most heater coatings are thick coatings that exacerbate this CTE mismatch problem.

The embodiments of the present disclosure solve several of the problems of existing heater technology. For example, advantages of embodiments of the present disclosure include the ability of rare earth oxide and oxyfluoride ALD coatings to provide conformal coverage for heaters, electrostatic chucks, and other components with complex geometries, including complex, high aspect ratio internal geometries that are otherwise unreachable via line-of-sight deposition techniques. Further, rare earth oxide and oxyfluoride ALD coated heaters exhibit a low sputter rate under high energy plasma bombardment, and are highly resistant to degradation by chemical/radical attacks (e.g., from $NF_3$ radicals). Rare earth oxide and oxyfluoride ALD coated heaters can also withstand (e.g., be exposed to without being damaged) higher temperatures compared to other coating techniques, which utilize much thicker coatings and thus build up higher stress in the presence of CTE mismatch. Rare earth oxide and oxyfluoride ALD coated heaters also naturally exhibit very high anti-oxidation performance. An ALD coating further allows for the tenability of coating CTE to match the CTE of different substrates in embodiments by tuning the ratios of different constituent materials in an ALD coating (e.g., the molar ratios of two or more metals).

The heater may be formed from an aluminum nitride (AlN) material or other suitable material having a comparable chemical resistance and mechanical, thermal and electrical properties. The heater material may have embedded therein wires (e.g., tungsten wires) to supply electricity. In embodiments, the heater material may be an AlN ceramic, a silicon carbide (SiC) ceramic, an aluminum oxide ($Al_2O_3$) ceramic, graphite, or any combination thereof. Different heater materials may have different reaction properties such that one composition may form a reactant with a higher vapor pressure than another composition when exposed to high temperatures, low vacuum pressures, and aggressive chemistries. For example, when a typical high temperature heater having an AlN material ceramic is exposed to nitrogen trifluoride ($NF_3$) plasma under high temperature (e.g., up to about 650° C.) and vacuum conditions (e.g., about 50 mTorr to about 200 mTorr), the reaction produces aluminum trifluoride ($AlF_3$), which has a vapor pressure of about log (p/kpa)=11.70–14950 (T/K). The $AlF_3$ is thus able to sublime and deposit onto other components within the chamber. During a subsequent process step, the deposited material may peel or flake or otherwise detach from the other chamber components and deposit as particles onto a wafer therein resulting in defects.

ALD allows for a controlled self-limiting deposition of material through chemical reactions with the surface of the article. Aside from being a conformal process, ALD is also a uniform process and is capable of forming very thin films, for example, having a thickness of about 3 nm or more. All exposed surfaces of the article will have the same or approximately the same amount of material deposited. As set forth herein, the heater may have the same or substantially the same thermal conductivity and heating capacity as the uncoated heater. A typical reaction cycle of an ALD process starts with a precursor (i.e., a single chemical A) flooded into an ALD chamber and adsorbed onto surfaces of the article (including surfaces of pore walls within the article). The excess precursor is then flushed out of the ALD chamber before a reactant (i.e., a single chemical R) is introduced into the ALD chamber and subsequently flushed out. For ALD, the final thickness of material is dependent on the number of reaction cycles that are run, because each reaction cycle will grow a layer of a certain thickness that may be one atomic layer or a fraction of an atomic layer.

The ALD technique can deposit a thin layer of material at a relatively low temperature (e.g., about 25° C. to about 350° C.) so that it does not damage or deform any materials of the component. Additionally, the ALD technique can also deposit a layer of material within complex features (e.g., high aspect ratio features) of the component. Furthermore, the ALD technique generally produces relatively thin (i.e., 1 μm or less) coatings that are porosity-free (i.e., pin-hole free), which may eliminate crack formation during deposition.

FIG. 1 is a sectional view of a semiconductor processing chamber 100 having one or more chamber components that are coated with a coating layer in accordance with embodiments. The base materials of the processing chamber 100 may include one or more of aluminum (Al), titanium (Ti) and stainless steel (SST). The processing chamber 100 may be used for processes in which a corrosive plasma environment having plasma processing conditions is provided. For example, the processing chamber 100 may be a chamber for a plasma etcher or plasma etch reactor, a plasma cleaner, plasma enhanced chemical vapor deposition (CVD) or ALD reactors and so forth. Examples of chamber components that may include a coating layer (e.g., a ceramic coating) include a substrate support assembly 148, an electrostatic chuck (ESC) assembly 150, a ring (e.g., a process kit ring or single ring), a chamber wall, a base, a gas distribution plate, a showerhead, a liner, a liner kit, a shield, a plasma screen, a flow equalizer, a cooling base, a chamber viewport, a chamber lid, and so on. Coatings may be deposited on the components using various techniques, such as ALD, sputtering, ion assisted deposition, plasma spray coating, CVD, or other suitable techniques as would be appreciated by one of ordinary skill in the art. As illustrated, the substrate support assembly 148 has a ceramic coating layer 136, in accordance with one embodiment. However, it should be understood that any of the other chamber components, such as those listed above, may also include a coating layer.

Another example of a chamber component that may include a coating is a high temperature heater assembly. In some embodiments, the coating, which is described in greater detail below, is applied by ALD. ALD allows for the application of a conformal coating of a substantially uniform thickness that is porosity-free on all types of components with complex shapes and features having high aspect ratios.

In some embodiments, a coating comprising a rare earth metal may be grown or deposited using ALD with a rare earth metal-containing precursor and a reactant consisting of or containing oxygen, fluorine, or nitrogen. The rare earth metal-containing precursor may contain yttrium, erbium, lanthanum, lutetium, scandium, gadolinium, samarium, or dysprosium. The coating may additionally or alternatively be grown or deposited using ALD with a precursor for deposition of an adhesion layer having the same or a similar material to the underlying component material to be deposited. For example, an aluminum-containing precursor and nitrogen containing reactant may be used to form AlN, or an aluminum-containing precursor and oxygen-containing reactant may be used to form aluminum oxide ($Al_2O_3$). A stack or wear resistant layer may be grown or deposited on top of the adhesion layer using ALD with one or more precursors containing a rare earth metal. In some embodiments, the wear resistant layer can be deposited using sputtering, ion assisted deposition, plasma spray coating or CVD. The stack layer may have alternating thin layers of the rare earth metal-containing material and another oxide, fluoride, or nitride material, such as $Al_2O_3$, AlN, $Y_2O_3$, or $YF_3$.

In one embodiment, the rare earth metal-containing layer has a polycrystalline structure. In another embodiment, the rare earth metal-containing layer may have an amorphous structure. The rare earth metal-containing layer may include yttrium, erbium, lanthanum, lutetium, scandium, gadolinium, samarium, and/or dysprosium. For example, the rare earth metal-containing layer may include yttria ($Y_2O_3$), yttrium fluoride ($YF_3$), yttrium oxyfluoride ($Y_xO_yF_z$), yttrium zirconium oxide (YZrO), erbium oxide ($Er_2O_3$), erbium fluoride ($ErF_3$), erbium oxyfluoride ($Er_xO_yF_z$), erbium aluminum oxide ($Er_3Al_5O_{12}$), dysprosium oxide ($Dy_2O_3$), dysprosium fluoride ($DyF_3$), dysprosium oxyfluoride ($Dy_xO_yF_z$), gadolinium oxide ($Gd_2O_3$), gadolinium fluoride ($GdF_3$), gadolinium oxyfluoride ($Gd_xO_yF_z$), scandium oxide ($Sc_2O_3$), scandium fluoride ($ScF_3$), scandium oxyfluoride (ScOF), and so on. In embodiments, the rare earth metal layer is polycrystalline $Y_2O_3$, $YF_3$, or $Y_xO_yF_z$. In other embodiments, the rare earth metal layer is amorphous $Y_2O_3$, $YF_3$, or $Y_xO_yF_z$. In an embodiment, the rare earth metal-containing material may be co-deposited with another material. For example, a rare earth metal-containing oxide may be mixed with one or more other rare earth compounds such as $Y_2O_3$, gadolinium oxide ($Gd_2O_3$) and/or erbium oxide (e.g., $Er_2O_3$). A yttrium-containing oxide for the coating may be, for example, $Y_xDy_yO_z$, $Y_xGd_yO_z$, or $Y_xEr_yO_z$. The yttrium-containing oxide may be $Y_2O_3$ having a cubic structure with space group Ia-3 (206). The subscripts x, y, and z, may independently range, for example, from 0.1 to 10.

In one embodiment, the rare earth metal-containing layer is one of $Y_2O_3$, $Y_xZr_yO_z$, YZrOF, $Y_3Al_5O_{12}$ (YAG), $Y_4Al_2O_9$(YAM), $YF_3$, $Y_xO_yF_z$, $Er_2O_3$, $Er_3Al_5O_{12}$ (EAG), $ErF_3$, $Er_xO_yF_z$, $La_2O_3$, $Lu_2O_3$, $Sc_2O_3$, $ScF_3$, $Sc_xO_yF_z$, $Gd_2O_3$, $Sm_2O_3$ $Dy_2O_3$, or $Nd_2O_3$. The rare earth metal-containing layer may also be $YAlO_3$ (YAP), $Er_4Al_2O_9$ (EAM), $ErAlO_3$ (EAP), $Gd_4Al_2O_9$, $GdAlO_3$, $Nd_3Al_5O_{12}$, $Nd_4Al_2O_9$, $NdAlO_3$, a ceramic compound composed of $Y_4Al_2O_9$ and a solid-solution of $Y_2O_3$—$ZrO_2$, or any other coating composition described herein including other ternary variants of lanthanum, lutetium, scandium, gadolinium, samarium or dysprosium, or any other rare earth metal-containing compound discussed herein. Any of the aforementioned rare earth metal-containing materials may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In some embodiments, the rare earth metal-containing layer comprises $Y_2O_3$, $ZrO_2$, and/or $Al_2O_3$ in amounts selected from the following compositions: $Y_2O_3$ in a range of 50-75 mol %, $ZrO_2$ in a range of 10-30 mol %, and $Al_2O_3$ in a range of 10-30 mol %; $Y_2O_3$ in a range of 40-99 mol %, $ZrO_2$ in a range of 1-60 mol %, and $Al_2O_3$ in a range of 0-10 mol %; $Y_2O_3$ in a range of 60-75 mol %, $ZrO_2$ in a range of 20-30 mol %, and $Al_2O_3$ in a range of 0-5 mol %; $Y_2O_3$ in a range of 60-70 mol %, $ZrO_2$ in a range of 30-40 mol %, and $Al_2O_3$ in a range of 0-10 mol %; $Y_2O_3$ in a range of 50-60 mol % and $ZrO_2$ in a range of 40-50 mol %; $Y_2O_3$ in a range of 40-60 mol %, $ZrO_2$ in a range of 30-50 mol %, and $Al_2O_3$ in a range of 10-20 mol %; $Y_2O_3$ in a range of 40-50 mol %, $ZrO_2$ in a range of 20-40 mol %, and $Al_2O_3$ in a range of 20-40 mol %; $Y_2O_3$ in a range of 70-90 mol %, $ZrO_2$ in a range of 0-20 mol %, and $Al_2O_3$ in a range of 10-20 mol %; $Y_2O_3$ in a range of 60-80 mol %, $ZrO_2$ in a range of 0-10 mol %, and $Al_2O_3$ in a range of 20-40 mol %; $Y_2O_3$ in a range of 40-60 mol %, $ZrO_2$ in a range of 0-20 mol %, and $Al_2O_3$ in a range of 30-40 mol %; $Y_2O_3$ in a range of 30-60 mol %, $ZrO_2$ in a range of 0-20 mol %, and $Al_2O_3$ in a range of 30-60 mol %; $Y_2O_3$ in a range of 20-40 mol %, $ZrO_2$ in a range of 20-80 mol %, and $Al_2O_3$ in a range of 0-60 mol %; $Y_2O_3$ in a range of 0-10 mol %, $ZrO_2$ in a range of 20-30 mol %, and $Al_2O_3$ in a range of 50-60 mol %; $Y_2O_3$ in a range of 0-10 mol %, $ZrO_2$ in a range of 20-30 mol %, and $Al_2O_3$ in a range of 40-50 mol %; $Y_2O_3$ in a range of 0-10 mol %, $ZrO_2$ in a range of 10-20 mol %, and $Al_2O_3$ in a range of 50-60 mol %; $Y_2O_3$ in a range of 0-10 mol %, $ZrO_2$ in a range of 10-20 mol %, and $Al_2O_3$ in a range of 40-50 mol %; $Y_2O_3$ in a range of 10-20 mol %, $ZrO_2$ in a range of 20-30 mol %, and $Al_2O_3$ in a range of 50-60 mol %; $Y_2O_3$ in a range of 10-20 mol %, $ZrO_2$ in a range of 20-30 mol %, and $Al_2O_3$ in a range of 40-50 mol %; $Y_2O_3$ in a range of 10-20 mol %, $ZrO_2$ in a range of 10-20 mol %, and $Al_2O_3$ in a range of 50-60 mol %; $Y_2O_3$ in a range of 10-20 mol %, $ZrO_2$ in a range of 10-20 mol %, and $Al_2O_3$ in a range of 40-50 mol %; $Y_2O_3$ in a range of 0-10 mol %, $ZrO_2$ in a range of 40-50 mol %, and $Al_2O_3$ in a range of 10-20 mol %; $Y_2O_3$ in a range of 0-10 mol %, $ZrO_2$ in a range of 40-50 mol %, and $Al_2O_3$ in a range of 20-30 mol %; $Y_2O_3$ in a range of 0-10 mol %, $ZrO_2$ in a range of 50-60 mol %, and $Al_2O_3$ in a range of 10-20 mol %; $Y_2O_3$ in a range of 0-10 mol %, $ZrO_2$ in a range of 50-60 mol %, and $Al_2O_3$ in a range of 20-30 mol %; $Y_2O_3$ in a range of 10-20 mol %, $ZrO_2$ in a range of 40-50 mol %, and $Al_2O_3$ in a range of 10-20 mol %; $Y_2O_3$ in a range of 10-20 mol %, $ZrO_2$ in a range of 40-50 mol %, and $Al_2O_3$ in a range of 20-30 mol %; $Y_2O_3$ in a range of 10-20 mol %, $ZrO_2$ in a range of 50-60 mol %, and $Al_2O_3$ in a range of 10-20 mol %; $Y_2O_3$ in a range of 10-20 mol %, or $ZrO_2$ in a range of 50-60 mol %, and $Al_2O_3$ in a range of 20-30 mol %.

In some embodiments, the rare earth metal-containing layer comprises $Y_2O_3$ and $ZrO_2$ in amounts selected from the following compositions: $Y_2O_3$ in a range of 1-99 mol % and $ZrO_2$ in a range of 1-99 mol %; $Y_2O_3$ in a range of 1-50 mol % and $ZrO_2$ in a range of 50-99 mol %; $Y_2O_3$ in a range of 50-99 mol % and $ZrO_2$ in a range of 1-50 mol %; $Y_2O_3$ in a range of 50-75 mol % and $ZrO_2$ in a range of 25-50 mol %; $Y_2O_3$ in a range of 40-61 mol % and $ZrO_2$ in a range of 39-60 mol %; $Y_2O_3$ in a range of 65-99 mol % and $ZrO_2$ in a range of 1-35 mol %; $Y_2O_3$ in a range of 65-80 mol % and $ZrO_2$ in a range of 20-35 mol %; $Y_2O_3$ in a range of 60-70 mol % and $ZrO_2$ in a range of 30-40 mol %; $Y_2O_3$ in a range of 1-11 mol % and $ZrO_2$ in a range of 89-99 mol %; $Y_2O_3$ in a range of 11-21 mol % and $ZrO_2$ in a range of 79-89 mol %; $Y_2O_3$ in a range of 21-31 mol % and $ZrO_2$ in a range of 69-79 mol %; $Y_2O_3$ in a range of 31-41 mol % and $ZrO_2$ in a range of 59-69 mol %; $Y_2O_3$ in a range of 41-51 mol % and $ZrO_2$ in a range of 49-59 mol %; $Y_2O_3$ in a range of 51-61 mol % and $ZrO_2$ in a range of 39-49 mol %; $Y_2O_3$ in a range of 61-71 mol % and $ZrO_2$ in a range of 29-39 mol %; $Y_2O_3$ in a range of 71-81 mol % and $YF_3$ in a range of 19-29 mol %; $Y_2O_3$ in a range of 81-91 mol % and $YF_3$ in a range of 9-19 mol %; or $Y_2O_3$ in a range of 91-99 mol % and $YF_3$ in a range of 1-9 mol %.

In some embodiments, the rare earth metal-containing layer comprises $Y_2O_3$, $ZrO_2$, $Er_2O_3$, $Gd_2O_3$, and/or $SiO_2$ in amounts selected from the following compositions: $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol %, and SiO2 in a range of 5-15 mol %; $Y_2O_3$ in a range of 30-60 mol %, $ZrO_2$ in a range of 0-20 mol %, $Er_2O_3$ in a range of 20-50 mol %, $Gd_2O_3$ in a range of 0-10 mol %, and SiO2 in a range of 0-30 mol %; or $Y_2O_3$ in a range of 30-45 mol %, $ZrO_2$ in a range of 5-15% mol %, $Er_2O_3$ in a range of 25-60 mol %, and $Gd_2O_3$ in a range of 0-25 mol %.

In some embodiments, the rare earth metal-containing layer comprises $Y_2O_3$ and $YF_3$ in amounts selected from the following compositions: $Y_2O_3$ in a range of 1-99 mol % and $YF_3$ in a range of 1-99 mol %; $Y_2O_3$ in a range of 1-10 mol % and $YF_3$ in a range of 90-99 mol %; $Y_2O_3$ in a range of 11-20 mol % and $YF_3$ in a range of 80-89 mol %; $Y_2O_3$ in a range of 21-30 mol % and $YF_3$ in a range of 70-79 mol %; $Y_2O_3$ in a range of 31-40 mol % and $YF_3$ in a range of 60-69 mol %; $Y_2O_3$ in a range of 41-50 mol % and $YF_3$ in a range of 50-59 mol %; $Y_2O_3$ in a range of 51-60 mol % and $YF_3$ in a range of 40-49 mol %; $Y_2O_3$ in a range of 61-70 mol % and $YF_3$ in a range of 30-39 mol %; $Y_2O_3$ in a range of 71-80 mol % and $YF_3$ in a range of 20-29 mol %; $Y_2O_3$ in a range of 81-90 mol % and $YF_3$ in a range of 10-19 mol %; $Y_2O_3$ in a range of 91-99 mol % and $YF_3$ in a range of 1-9 mol %.

It is to be understood that the foregoing ranges are illustrative, and some variation may exist in the limits of each compound. For example, recitation of "$Y_2O_3$ in a range of 41-50 mol %" is understood to include all possible quantities of $Y_2O_3$ from and including 41 mol % up to and including 50 mol %, as well as from about 41 mol % up to about 50 mol % to account for approximations and measurement uncertainty.

Referring once again to FIG. 1, in one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material, such as titanium. The chamber body 102 generally includes sidewalls 108 and a bottom 110. One or more of the showerhead 130 (or lid and/or nozzle), sidewalls 108 and/or bottom 110 may include a coating layer.

An outer liner 116 may be disposed adjacent the sidewalls 108 to protect the chamber body 102. The outer liner 116 may be fabricated and/or coated with a coating layer. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes a gas distribution plate (GDP) 133 having multiple gas delivery holes 132 throughout the GDP 133. The showerhead 130 may include the GDP 133 bonded to an aluminum or an anodized aluminum showerhead base 104. The GDP 133 may be made from Si or SiC, or may be a ceramic such as $Y_2O_3$, $Al_2O_3$, YAG, and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound composed of $Y_4Al_2O_9$ and a solid-solution of $Y_2O_3$—$ZrO_2$. The nozzle may also be a ceramic, such as $Y_2O_3$, YAG, or the ceramic compound composed of $Y_4Al_2O_9$ and a solid-solution of $Y_2O_3$—$ZrO_2$. The lid, showerhead base 104, GDP 133 and/or nozzle may optionally be coated with a ceramic coating.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. The coating layer may be resistant to erosion from some or all of these gases and/or plasma generated from these gases. Examples of carrier gases include $N_2$, He, Ar, and other gases inert to process gases (e.g., non-reactive gases).

The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the ESC assembly 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resistant material such as those discussed with reference to the outer liner 116. In one embodiment, the inner liner 118 may be fabricated from the same materials of the outer liner 116. Additionally, the inner liner 118 may be coated with a ceramic coating.

In one embodiment, the substrate support assembly 148 includes a mounting plate 162 supporting a pedestal 152, and an ESC assembly 150. The ESC assembly 150 further includes a thermally conductive base 164 and an electrostatic puck 166 bonded to the thermally conductive base by a bond 138, which may be a silicone bond in one embodiment. An upper surface of the electrostatic puck 166 is covered by the ceramic coating layer 136 in the illustrated embodiment. In one embodiment, the ceramic coating layer 136 is disposed on the upper surface of the electrostatic puck 166. In another embodiment, the ceramic coating layer 136 is disposed on the entire exposed surface of the ESC assembly 150 including the outer and side periphery of the thermally conductive base 164 and the electrostatic puck 166. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heating elements 176 are regulated by a heater power source 178. The conduits 168, 170 and heating elements 176 may be utilized to control the temperature of the thermally conductive base 164, thus heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, which may be formed in an upper surface of the puck 166 and/or the ceramic coating layer 136. The gas passages may be fluidly coupled to a source of a heat transfer (or backside) gas such as helium via holes drilled in the puck 166. In operation, the backside gas may be provided at controlled pressure into the gas passages to enhance the heat transfer between the electrostatic puck 166 and the substrate 144. The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing an RF signal having a frequency from about 50 kHz to about 3 GHz, with a power output of up to about 10,000 Watts.

The ALD technique enables a conformal coating of relatively uniform thickness and zero porosity (i.e., porosity-free) on the surfaces of chamber components and on features having complex geometries, including interior geometries that are unreachable via traditional line-of-sight deposition techniques. The coating may be plasma resistant to reduce plasma interactions and improve a component's durability without impacting its performance. A thin coating deposited with ALD may maintain the electrical properties and relative shape and geometric configuration of the component so as to not disturb its functionality. The coating may also reduce the volatility of the component's materials and may form reactants having a lower vapor pressure than the component's underlying materials.

The resistance of the coating to plasma may be measured through "etch rate" (ER), which may have units of micrometer/hour ($\mu$m/hr) or Angstrom/hour (Å/hr), throughout the duration of the coated components' operation and exposure to plasma. Measurements may be taken after different processing times. For example, measurements may be taken before processing, or at about 50 processing hours, or at about 150 processing hours, or at about 200 processing hours, and so on. Variations in the composition of the coating grown or deposited on the heater support and/or other components may result in multiple different plasma resistances or erosion rate values. Additionally, a coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma.

Figure 2A:
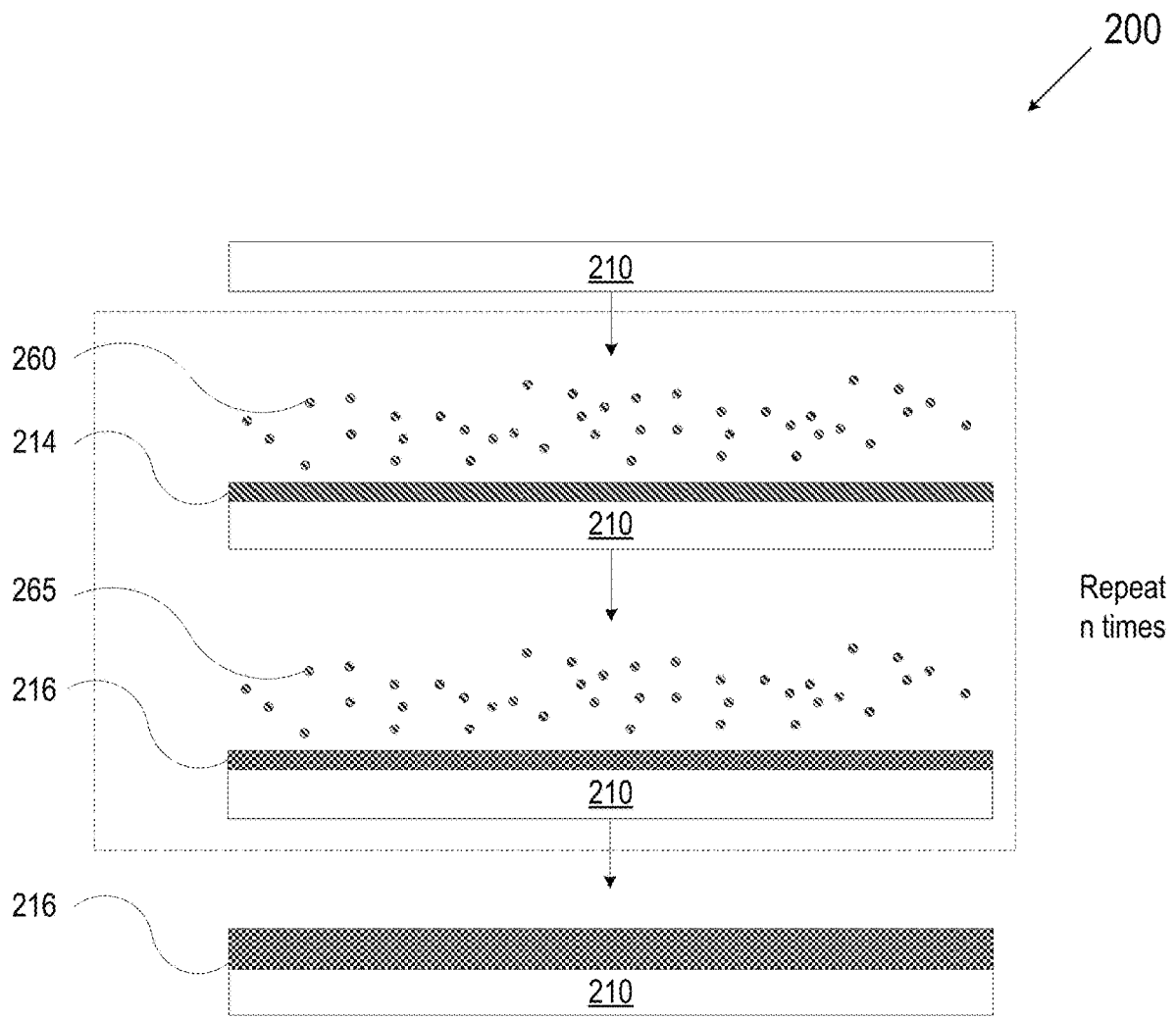
FIG. 2A depicts one embodiment of a deposition process in accordance with an atomic layer deposition technique as described herein.
Figure 2B:
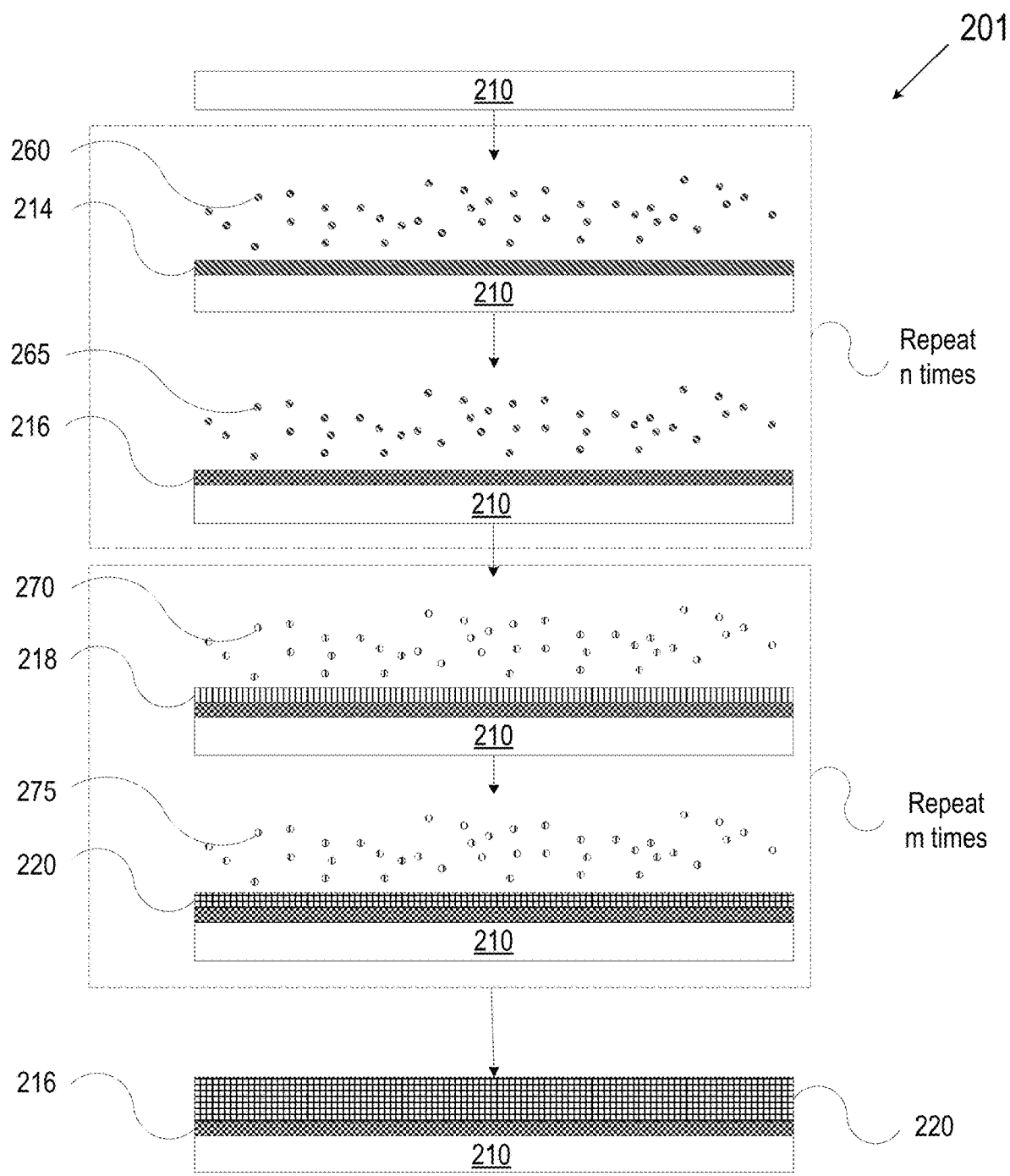
FIG. 2B depicts another embodiment of a deposition process in accordance with an atomic layer deposition technique as described herein.
Figure 2C:
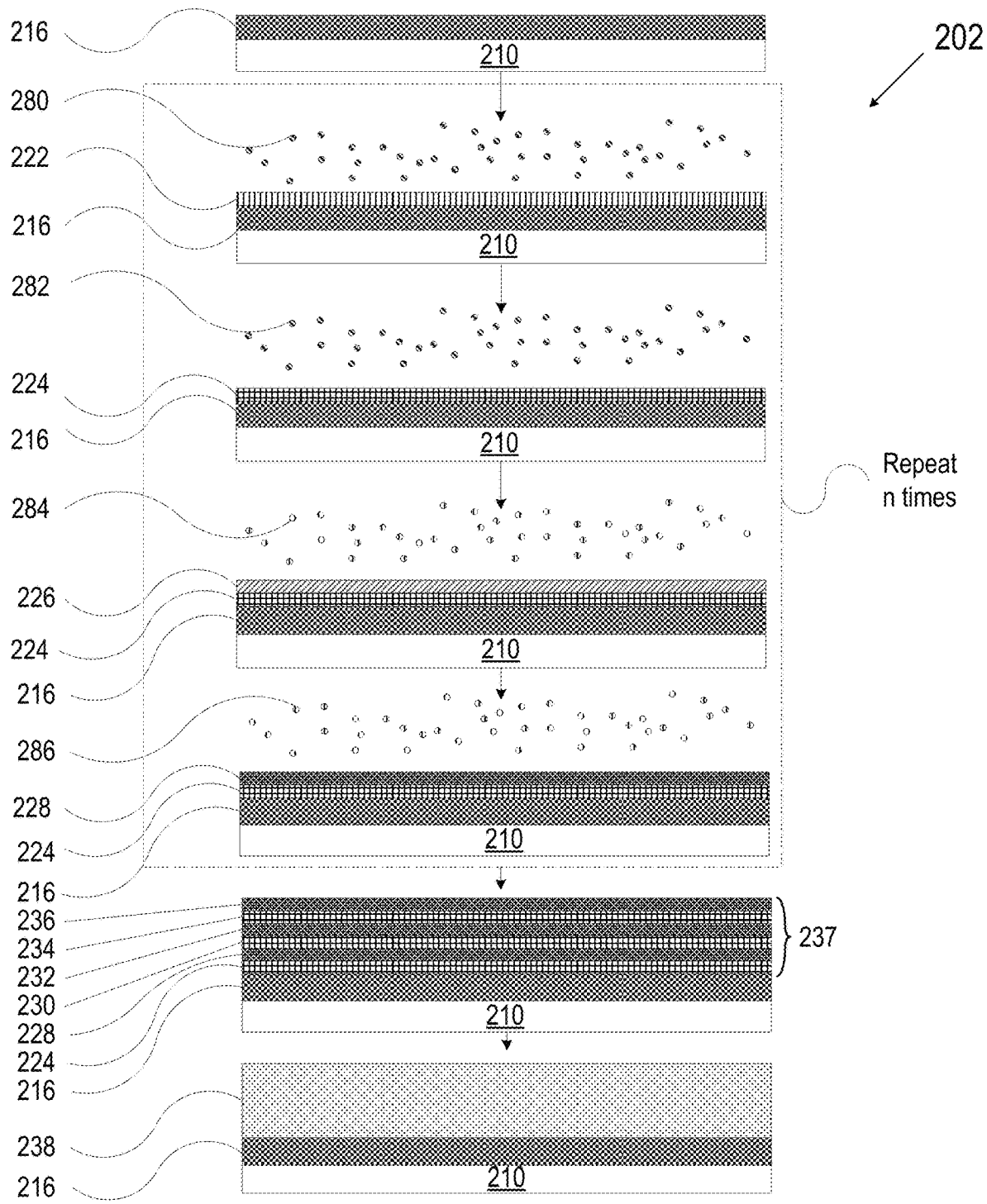
FIG. 2C depicts another embodiment of a deposition process in accordance with an atomic layer deposition technique as described herein.

FIG. 2A depicts one embodiment of a deposition process 200 in accordance with an ALD technique to grow or deposit a coating on an article (e.g., a heater support, an entire heater assembly, portions of an electrostatic chuck, etc.). FIG. 2B depicts one embodiment of a deposition process 201 in accordance with an ALD technique to grow or deposit a multi-layer plasma resistant coating on an article. FIG. 2C depicts another embodiment of a deposition process 202 in accordance with an ALD technique as described herein.

Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner.

FIGS. 2A-2C illustrate an article 210 having a surface. Article 210 may represent various materials of semiconductor process chamber components including but not limited to a high temperature heater support and/or all surfaces of a heater assembly within a processing chamber. The article 210 may be made from a material comprising AlN, a dielectric material such as a ceramic, a metal-ceramic composite (e.g., $Al_2O_3/SiO_2$, $Al_2O_3/MgO/SiO_2$, SiC, $Si_3N_4$, $AlN/SiO_2$ and the like), a metal (such as aluminum, stainless steel), graphite, or other suitable materials, and may further comprise materials such as AlN, Si, SiC, $Al_2O_3$, $SiO_2$, and so on. In one embodiment, the article 210 is a high temperature heater comprised of a heater material having a thermal conductivity of about 50 W/mK to about 300 W/mK, or about 100 W/mK to about 250 W/mK, about 150 W/mK to about 200 W/mK, or about 180 W/mK. The heater material may also have a specific heat capacity of about 0.15 cal/g-° C. at 25° C. to about 0.30 cal/g-° C. at 25° C., or about 0.20 cal/g-° C. at 25° C. to about 0.25 cal/g-° C. at 25° C., or about 0.25 cal/g-° C. at 25° C. The heater material may also have a CTE of about 4.6 to about 5.7 m/m-° C. In one embodiment, the article 210 is, for example, a high temperature heater for a semiconductor process chamber fabricated from an AlN ceramic material. Such material reacts with fluorine plasmas (e.g., $NF_3$) in the process chamber during cleaning and form $AlF_3$. The $AlF_3$ has a high vapor pressure so that this reactant sublimes and deposits on other components within the chamber. During a subsequent process stage, the deposited $AlF_3$ flakes, peels or otherwise detaches from the other chamber components and contaminates the wafer therein with particles.

For ALD, either adsorption of a precursor onto a surface or a reaction of a reactant with the adsorbed precursor may be referred to as a "half-reaction." During a first half reaction, a precursor is pulsed onto a surface of the article 210 for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In some embodiments, two or more precursors are injected together and adsorbed onto the surface of an article 210. The excess precursors are pumped out, and an oxygen-containing reactant (or fluorine containing reactant) is then injected to react with the adsorbates to form a component layer (e.g., of $Y_2O_3$—$Al_2O_3$). This fresh layer is ready to adsorb the precursors in the next cycle.

In FIG. 2A, article 210 may be introduced to a first precursor 260 for a first duration until a surface of article 210 is fully adsorbed with the first precursor 260 to form an adsorption layer 214. Subsequently, article 210 may be introduced to a first reactant 265 to react with the adsorption layer 214 to grow a solid layer 216 (e.g., so that the layer 216 is fully grown or deposited, where the terms grown and deposited may be used interchangeably herein). For a single layer coating, the first precursor 260 may be a precursor for a rare earth metal-containing material such as $Y_2O_3$, $YF_3$ or $Y_xO_yF_z$. Examples of precursors include yttrium precursors, zirconium precursors, erbium precursors, and so on. When an adhesion layer is used, the first precursor 260 may be a precursor containing Al in some embodiments. The first reactant 265 may be oxygen, water vapor, ozone, oxygen radicals, or another oxygen source if layer 216 is an oxide. If layer 216 contains AlN, the first reactant 265 may be, for example, $NH_3$ nitrogen radicals, or other nitrogen source. If layer 216 is a fluoride, then a fluorine-containing reactant may be used. Accordingly, ALD may be used to form the layer 216. The layer 216 may be a single-layer coating, or may be one layer (i.e., an adhesion layer) of a multi-layer coating.

In an example where the layer 216 is an AlN adhesion layer, article 210 (e.g., a surface of a high temperature heater) may be introduced to a first precursor 260 (e.g., a trimethylaluminum or TMA precursor) for a first duration until all the reactive sites on the article's surfaces are consumed. The remaining first precursor 260 is flushed away and then a first reactant 265 of $NH_3$ is injected into the reactor to start the second half cycle. A layer 216 of AlN forms after $NH_3$ molecules react with the Al containing adsorption layer created by the first half reaction.

Layer 216 may be uniform, continuous and conformal. Layer 216 may be porosity free (e.g., have a porosity of zero) or have an approximately zero porosity in embodiments (e.g., a porosity of 0% to 0.01%). Layer 216 may have a thickness of less than one atomic layer to a few atoms in some embodiments after a single ALD deposition cycle. Some metalorganic precursor molecules are large. After reacting with the reactant 265, large organic ligands may no longer be present, leaving much smaller metal atoms. One full ALD cycle (e.g., that includes introduction of precursors 260 followed by introduction of reactants 265) may result in the formation of a layer with an average thickness less than a single unit cell. For example, an AlN monolayer grown by TMA and $NH_3$ typically has a growth rate of about 1.0 Å/cycle while the AlN lattice constants are a=3.111A and c=4.981A (for a hexagonal structure).

Multiple full ALD deposition cycles may be implemented to deposit a thicker layer 216, with each full cycle (e.g., including introducing precursor 260, flushing, introducing reactant 265, and again flushing) adding to the thickness by an additional fraction of an atom to a few atoms. As shown, up to n full cycles may be performed to grow the layer 216, where n is an integer value greater than 1. In embodiments, layer 216 may have a thickness of about 5 nm to about 10 μm, or about 25 nm to about 5 μm, or about 50 nm to about 500 nm, or about 75 nm to about 200 nm. In some embodiments, the thickness of the coating may be about 50 nm, or about 75 nm, or about 100 nm, or about 125 nm, or about 150 nm. If layer 216 is an adhesion layer, the thickness of the adhesion layer may be about 1 nm to about 50 nm, or about 2 nm to about 25 nm, or about 5 nm to about 10 nm. In certain embodiments, the thickness of the adhesion layer is about 1 nm, or about 5 nm, or about 10 nm, or about 15 nm.

When layer 216 is a coating comprising one or more rare earth metal-containing materials, the layer 216 provides robust plasma resistance and mechanical properties without significantly impacting the thermal and electrical properties of the heater. Layer 216 may protect the component from erosion, enhance or maintain dielectric strength and may be resistant to cracking at temperatures up to about 500° C., or up to about 550° C., or from about 500° C. to about 550° C. When layer 216 is an adhesion layer, it may improve adhesion of a rare earth metal-containing layer (or a stack layer) to the component and prevent cracking of the coating at temperatures of up to about 650° C.

FIG. 2B describes a deposition process 201 that includes the deposition of layer 216 as an adhesion or barrier layer as described with reference to FIG. 2A. However, the deposition process 201 of FIG. 2B further includes deposition of an additional layer 220 to form a multi-layer plasma resistant coating. Accordingly, after layer 216 is complete, article 210 having layer 216 may be introduced to an additional one or more precursors 270 for a second duration until layer 216 is fully adsorbed with the one or more additional precursors 270 to form an adsorption layer 218. Subsequently, article 210 may be introduced to a reactant 275 to react with adsorption layer 218 to grow a solid rare earth metal-containing oxide layer 220, also referred to as the second layer 220 for simplicity (e.g., so that the second layer 220 is fully grown or deposited). In this embodiment, layer 216 may be an adhesion or barrier layer containing AlN. Accordingly, the second layer 220 is fully grown or deposited over layer 216 using ALD. In an example, precursor 270 may be a yttrium containing precursor used in the first half cycle, and reactant 275 may be $H_2O$ used in the second half cycle.

The second layer 220 may form a yttrium-containing oxide layer or other rare earth metal-containing oxide layer, which may be uniform, continuous, and conformal. The second layer 220 may have a very low porosity of less than 1% in embodiments, and less than 0.1% in further embodiments, and about 0% in embodiments or porosity-free in still further embodiments. Second layer 220 may have a thickness of less than an atom to a few atoms (e.g., 2-3 atoms) after a single full ALD deposition cycle. Multiple ALD deposition stages may be implemented to deposit a thicker second layer 220, with each stage adding to the thickness by an additional fraction of an atom to a few atoms. As shown, the full deposition cycle may be repeated m times to cause the second layer 220 to have a target thickness, where m is an integer value greater than 1. In embodiments, second layer 220 may have a thickness of about 5 ALD cycles (e.g., about 0.9 Å/cycle and two half-reactions) to about 5 μm. If second layer 220 is the first layer of a stack layer, then it may have a thickness of about 5 ALD cycles to about 500 nm, or about 6 ALD cycles to about 250 nm, or about 7 ALD cycles to about 100 nm, or about 8 ALD cycles to about 50 nm. In embodiments, the thickness of the second layer 220 of the stack is about 5 to about 15 ALD cycles, or about 6 to about 14 ALD cycles, or about 7 to about 13 ALD cycles, or about 8 to about 10 ALD cycles.

A ratio of the second layer 220 thickness to the layer 216 thickness may be 200:1 to 1:200. A higher ratio of the second layer 220 thickness to the layer 216 thickness (e.g., 200:1, 100:1, 50:1, 20:1, 10:1, 5:1, 2:1 etc.) provides better corrosion and erosion resistance, while a lower ratio of the second layer 220 thickness to the layer 216 thickness (e.g., 1:2, 1:5, 1:10, 1:20, 1:50, 1:100, 1:200) provides better heat resistance (e.g., improved resistance to cracking and/or delamination caused by thermal cycling).

Second layer 220 may be any of the rare earth metal-containing oxide layers discussed herein. For example, second layer 220 may be $Y_2O_3$, $YF_3$ or $Y_xO_yF_z$, alone or in combination with one or more other rare earth metal materials. In some embodiments, second layer 220 is a single phase material formed from a mixture of at least two rare earth metal-containing precursors that have been co-deposited by ALD (e.g., combinations of one or more of $Y_2O_3$, $Er_2O_3$ and $Al_2O_3$). For example, second layer 220 may be one of $Y_xEr_yO_z$ or $Y_xAl_yO_z$. In one embodiment, layer 216 is amorphous AlN and the second layer 220 is a polycrystalline or amorphous yttrium-containing oxide compound (e.g., $Y_2O_3$, $Y_xAl_yO_z$, $Y_xEr_yO_z$, etc.) alone or in a single phase with one or more other rare earth metal-containing material. In another embodiment, article 210 is a graphite article, layer 216 is amorphous carbon, and the second layer 220 is a polycrystalline or amorphous yttrium-containing compound (e.g., $Y_2O_3$, YZrO, $YF_3$, $Y_xAl_yO_z$, $Y_xEr_yO_z$, etc.). Layer 216 may not only enhance adhesion, but may also function as a stress relief layer that is deposited prior to deposition of the yttrium-containing oxide layer.

In some embodiments, second layer 220 may include $Er_2O_3$, $Y_2O_3$ or $Al_2O_3$. In some embodiments, second layer 220 is a multi-component material of at least one of $Er_xAl_yO_z$ (e.g., $Er_3Al_5O_{12}$), $Y_xAl_yO_z$, $Y_xEr_yO_z$, or $Er_aY_xAl_yO_z$ (e.g., a single phase solid solution of $Y_2O_3$, $Al_2O_3$ and $Er_2O_3$).

In some embodiments, the thickness of the layer 216 may be about 1 nm to about 50 nm, or about 2 nm to about 25 nm, or about 5 nm to about 10 nm. In certain embodiments, the thickness of the layer 216 is about 1 nm, or about 5 nm, or about 10 nm, or about 15 nm. The thickness of the rare earth metal-containing layer may be about 5 nm to about 10 μm, or about 25 nm to about 5 μm, or about 50 nm to about 500 nm, or about 75 nm to about 200 nm. In some embodiments, the thickness of the second layer 220 may be about 50 nm, or about 75 nm, or about 100 nm, or about 125 nm, or about 150 nm. In certain embodiments, the total thickness of the coating including the layer 216 and the second layer 220 may be about 50 nm, or about 75 nm, or about 100 nm, or about 125 nm, or about 150 nm.

With reference to FIG. 2C, in some embodiments, the multi-layer coating contains more than two layers. Specifically, the coating may include a stack comprising a sequence of alternating layers of another material (e.g., AlN, ZrO, $Y_2O_3$, or other compound disclosed herein) and the rare earth metal-containing oxide layer, or may include layer 216 and a sequence of alternating layers for the rare earth metal-containing oxide layer. In some embodiments, a rare earth metal-containing oxide layer is a layer of alternating sub-layers. For example, a rare earth metal-containing oxide layer may be a series of alternating sublayers of $Y_2O_3$ and AlN, a series of alternating sublayers of $Y_2O_3$ and $ZrO_2$ or a series of alternating sublayers of $Y_2O_3$ and $Al_2O_3$.

Referring to FIG. 2C, an article 210 having a layer 216 may be inserted into a deposition chamber. The layer 216 may have been formed as set forth with reference to FIG. 2A or FIG. 2B. Article 210 may be introduced to one or more precursors 280 containing one or more rare earth metal-containing materials for a duration until layer 216 is fully adsorbed with the one or more precursors 280 to form layer 222. Subsequently, article 210 may be introduced to a reactant 282 to react with layer 222 to grow layer 224. Accordingly, the rare earth metal-containing layer 224 is fully grown or deposited over layer 216 using ALD. In an example, precursor 280 may be a yttrium containing precursor used in the first half cycle, and reactant 282 may be $H_2O$ used in the second half cycle. The rare earth metal-containing layer 224 may be a first one of $Y_2O_3$, $Er_2O_3$, $ZrO_2$ or another oxide.

Article 210 having layer 216 and metal oxide layer 224 may be introduced to one or more precursors 284 for a duration until the layer 224 is fully adsorbed with the one or more precursors 284 to form layer 226. Subsequently, article 210 may be introduced to a reactant 286 to react with layer 226 to grow an additional layer 228. Accordingly, the additional layer 228 (which may be of the same material as the layer 224) is fully grown or deposited over the rare earth metal-containing layer 224 using ALD.

As shown, the deposition of the rare earth metal-containing layer 224 and the aluminum oxide layer 228 may be repeated n times to form a stack 237 of alternating layers, where n is an integer value greater than 2. N may represent a finite number of layers selected based on the targeted thickness and properties. The stack 237 of alternating layers may be considered as a rare earth metal-containing oxide layer containing multiple alternating sub-layers. Accordingly, precursors 280, reactants 282, precursors 284 and reactants 286 may be repeatedly introduced sequentially to grow or deposit additional alternating layers 230, 232, 234, 236, and so on. Each of the layers 224, 224, 230, 232, 234, 236, and so on may be very thin layers having an average thickness of less than a single atomic layer to a few atomic layers.

The alternating layers 224-236 described above have a 1:1 ratio, where there is a single layer of a first metal oxide for each interspersed layer. However, in other embodiments there may be other ratios such as 2:1, 3:1, 4:1, and so on between the different types of layers. For example, two $Y_2O_3$ layers may be deposited for every interspersed layer of a different material in an embodiment. Additionally, the stack 237 of alternating layers 224-236 has been described as an alternating series of two types of metal layers. However, in other embodiments more than two types of metal layers may be deposited in an alternating stack 237. For example, the stack 237 may include three different alternating layers.

After the stack 237 of alternating layers has been formed, an anneal process may be performed to cause the alternating layers of different materials to diffuse into one another and form a complex oxide having a single phase or multiple phases. After the annealing process, the stack 237 of alternating layers may therefore become a single rare earth metal-containing oxide layer 238. For example, if the layers in the stack are $Y_2O_3$ and $Al_2O_3$, then the resulting rare earth metal-containing oxide layer 238 may contain a $Y_3Al_5O_{12}$ (YAG) phase.

Each layer of the rare earth metal-containing material may have a thickness of about 5-10 angstroms and may be formed by performing about 1 to about 10 cycles of an ALD process, where each cycle forms a nanolayer (or slightly less or more than a nanolayer) of the rare earth metal-containing material. In one embodiment, each layer of the rare earth metal-containing oxide is formed using about 6 to about 8 ALD cycles. Each interspersed layer may be formed from about 1 to about 2 ALD cycles (or a few ALD cycles) and may have a thickness of less than an atom to a few atoms. Layers of the rare earth metal-containing material may each have a thickness of about 5-100 angstroms, and layers of the second oxide may each have a thickness of about 1-20 angstroms in embodiments, and a thickness of 1-4 angstroms in further embodiments. The stack 237 of alternating layers may have a total thickness of about 5 nm to about 3 μm. The thin interspersed layers between the layers of the rare earth metal-containing material may prevent crystal formation in the rare earth metal-containing layers. This may enable an amorphous yttria layer to be grown.

In the embodiments described with reference to FIGS. 2A-2C, the surface reactions (e.g., half-reactions) are done sequentially, and the various precursors and reactants are not in contact in embodiments. Prior to introduction of a new precursor or reactant, the chamber in which the ALD process takes place may be purged with an inert carrier gas (such as nitrogen or air) to remove any unreacted precursor and/or surface-precursor reaction byproducts. The precursors will be different for each layer and the second precursor for the yttrium-containing oxide layer or other rare earth metal-containing oxide layer may be a mixture of two rare earth metal-containing precursors to facilitate co-deposition of these compounds to form a single phase material layer. In some embodiments, at least two precursors are used, in other embodiments at least three precursors are used and in yet further embodiments at least four precursors are used.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a CVD mechanism. The ALD temperature window may range from about 100° C. to about 650° C. In some embodiments, the ALD temperature window is from about 20° C. to about 200° C., or about 25° C. to about 150° C., or about 100° C. to about 120° C., or about 20° C. to 125° C.

The ALD process allows for a conformal coating having uniform thickness on articles and surfaces having complex geometric shapes, holes with high aspect ratios (e.g., pores), and three-dimensional structures. Sufficient exposure time of each precursor to the surface enables the precursor to disperse and fully react with the surfaces in their entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in situ on demand material synthesis of a particular composition or formulation without a lengthy and difficult fabrication of source materials (such as powder feedstock and sintered targets). In some embodiments ALD is used to coat articles having aspect ratios of about 3:1 to 300:1.

With the ALD techniques described herein, multi-component films such as $Y_xAl_yO_z$ (e.g., $Y_3Al_5O_{12}$), $Y_xEr_yO_z$, $Y_xEr_yF_z$, or $Y_wEr_xO_yF_z$ can be grown, deposited or co-deposited, for example, by proper mixtures of the precursors used to grow the rare earth metal-containing oxides alone or in combination with one or more other oxides as described above and in more detail in the examples below.

In some embodiments a wear resistant layer containing one or more rare earth metal-containing materials may be deposited over the stack layer. The wear resistant layer may have a thickness of about 5 nm to about 5000 nm, about 5 nm to about 1000 nm, about 100 nm to about 5000 nm, or about 100 nm to about 500 nm.

Figure 3:
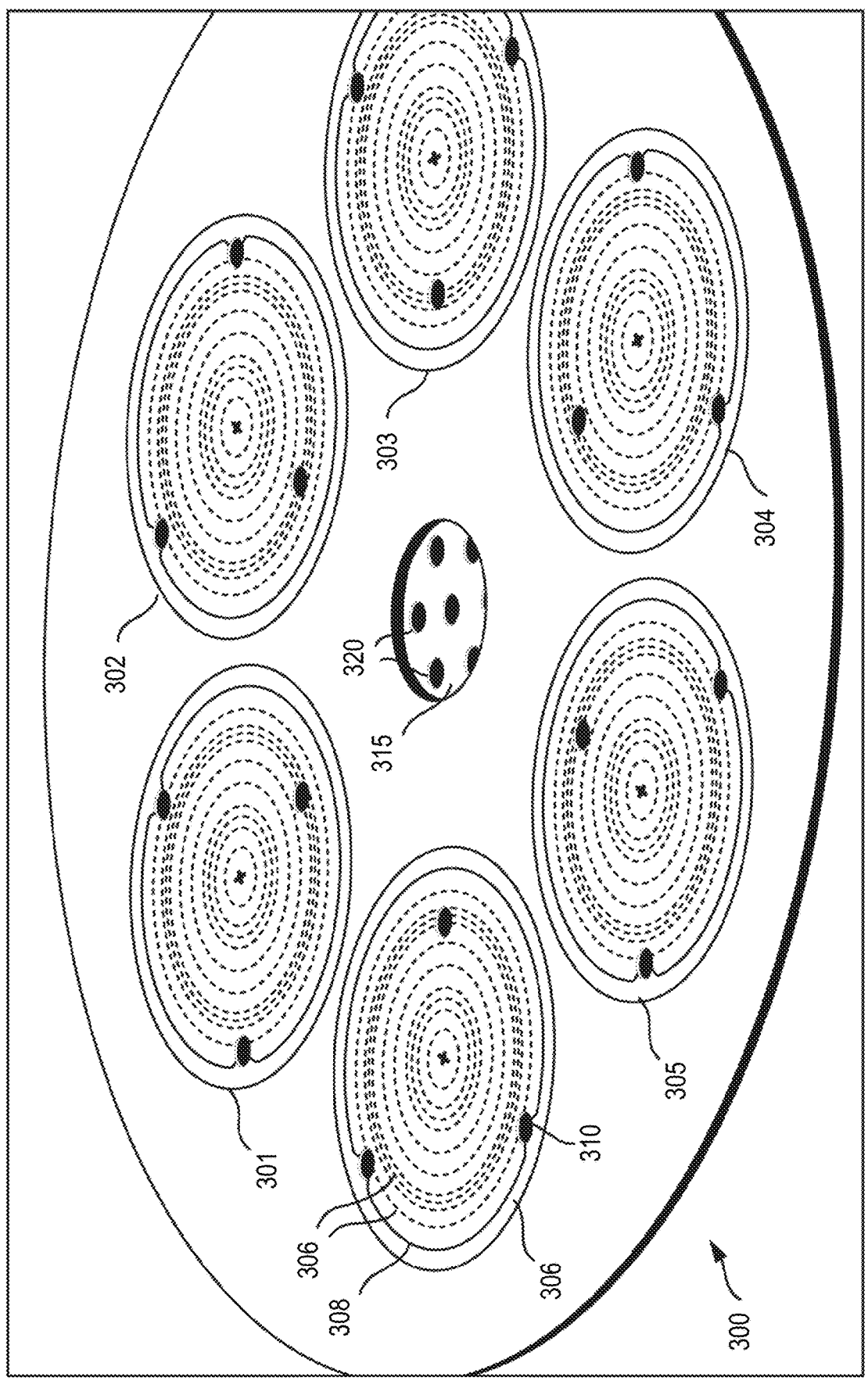
FIG. 3 depicts an exemplary susceptor having a ceramic coating formed thereon in accordance with embodiments.

Reference is now made to various high temperature components that may be coated with rare earth metal-containing coatings via ALD. FIG. 3 depicts an example susceptor 300 for an ALD chamber. The susceptor 300 has a protective coating, such as a rare earth metal-containing ceramic coating as described herein. In one embodiment, the thin film protective coating coats just an upper surface of the susceptor. Alternatively, the thin film protective coating coats an upper and a lower surface of the susceptor. The thin film protective layer may also coat side walls of the susceptor and interior surfaces of the susceptor. The susceptor 300 may be used to support and uniformly heat multiple wafers simultaneously. The susceptor 300 may be heated radiatively using resistive heating elements or lamps. In one embodiment, the susceptor 300 includes a thermally conductive base, such as graphite. The susceptor 300 may have a disc-like shape that may be large enough to support multiple substrates (e.g., multiple wafers). In one embodiment, the susceptor has a diameter of over 1 meter.

The susceptor 300 may include one or more depressions (also referred to as pockets) 301-306, each of which may be configured to support a wafer or other substrate during processing. In the illustrated example the susceptor 300 includes six depressions 301-306. However, other susceptors may have more or fewer depressions. Each of the depressions 301-306 includes various surface features. Examples of surface features in depression 301 include an outer ring 308, multiple mesas 306 and channels or gas passages between the mesas 306. The features may have heights of approximately 10-80 micrometers in some embodiments.

The depressions 301-306 and surface features (e.g., mesas 306 and outer ring 308) may be fluidly coupled to a source of a heat transfer (or backside) gas, such as He via holes drilled in the susceptor 300. In operation, the backside gas may be provided at controlled pressure into the gas passages to enhance the heat transfer between the susceptor 300 and a substrate.

The susceptor 300 may further include lift pin holes 310. For example, the susceptor 300 may include three lift pin holes that support lift pins (e.g., $Al_2O_3$ lift pins). The lift pins enable the loading and unloading of wafers onto the susceptor 300. The susceptor 300 may include a depression 315 that may be used to clamp the susceptor to a rotating spindle. The depression 315 may include holes 320, which may be used to mechanically fasten the susceptor 300 to the rotating spindle.

In some embodiments, the susceptor 300 is formed from graphite and may be coated using ALD to form a rare earth metal-containing coating. To promote adhesion of the rare earth metal-containing coating to the susceptor 300, an adhesion layer may be formed on the susceptor 300, such as a carbon layer deposited via CVD.

Figure 4:
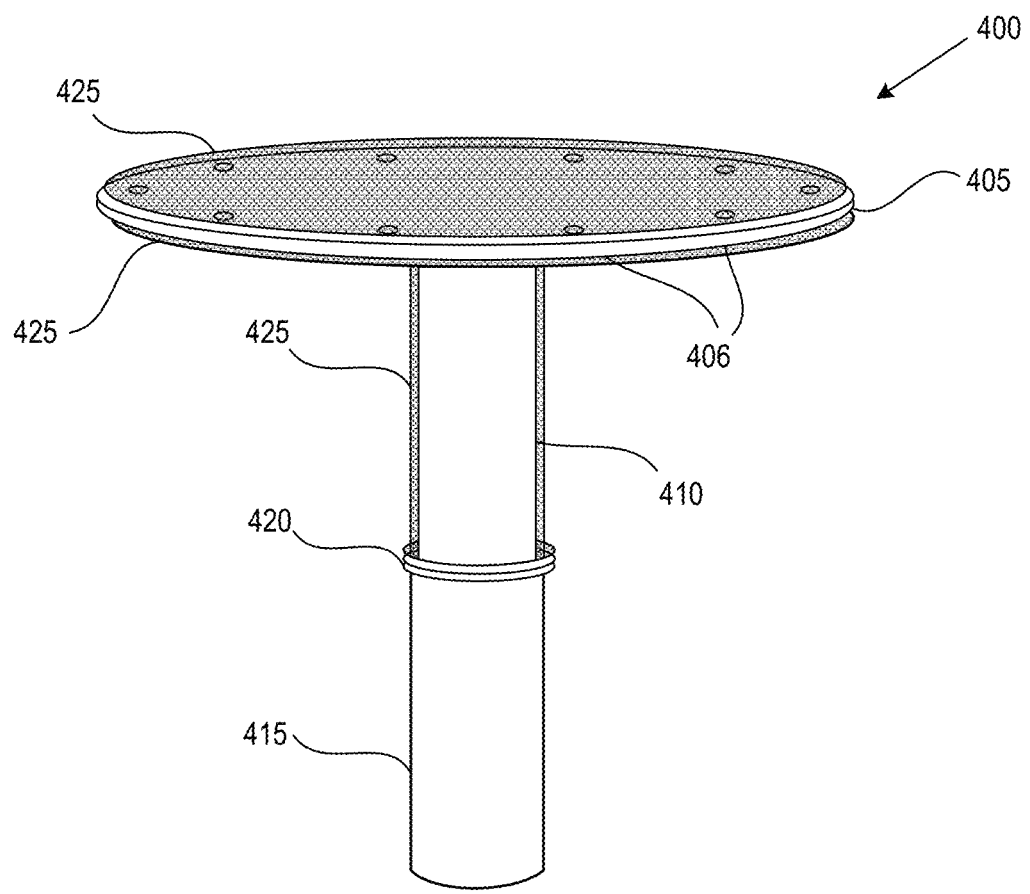
FIG. 4 depicts an exemplary heater assembly having a ceramic coating formed thereon in accordance with embodiments.

FIG. 4 depicts coated components of a heater assembly 400 in accordance with embodiments. The processing chamber 100 may be adapted to include the heater assembly 400. For example, the heater assembly 400 may be disposed in the interior volume 106 of the processing chamber 100 below the showerhead 130 or lid. The heater assembly 400 includes a support 405 for holding a substrate (e.g., a wafer) during processing, with the support 405 being attached to an end of an interior shaft 410. The interior shaft 410 may be situated within the interior volume of the processing chamber 100. The interior shaft 410 is attached to an exterior shaft 415 via a flange 420, and the exterior shaft 415 may be coupled to the chamber body 102 of the processing chamber 100 by a flange (not shown). The support 405 includes mesas 406, which are connected to electrical components (not shown) embedded within the heater material of the support 405. All surfaces that may be exposed to corrosive gases and plasmas within the processing chamber are coated with a coating 425 (e.g., a ceramic coating) in accordance with embodiments described herein.

The support 405, shafts 410, 415, and flange 420 may be constructed of a heater material containing AlN, for example, an AlN ceramic. In one embodiment, the support 405 may include metallic heater and sensor layers that are sandwiched between AlN ceramic layers. Such an assembly may be sintered in a high-temperature furnace to create a monolithic assembly. The layers may include a combination of heater circuits, sensor elements, ground planes, radio frequency grids and metallic and ceramic flow channels. The heater assembly 400 may provide a heater temperature up to about 650° C. under vacuum conditions (e.g., about 1 mTorr to about 5 Torr).

The coating 425 may comprise one or more rare earth metal-containing oxide material on a surface of the support 405 and/or on all surfaces of the heater assembly 400 that may be exposed to corrosive gases or plasma within the processing chamber. The coating 425 may be a single-layer coating or a multi-layer coating having little or no impact on the thermal properties of the material of the support 405 or on the performance of the heater assembly 400, generally. In some embodiments, the coating may have a thickness of about 5 nm to about 10 m, or about 25 nm to about 5 μm, or about 50 nm to about 500 nm, or about 75 nm to about 200 nm. In some embodiments, the thickness of the coating may be about 50 nm, or about 75 nm, or about 100 nm, or about 125 nm, or about 150 nm.

Figure 5:
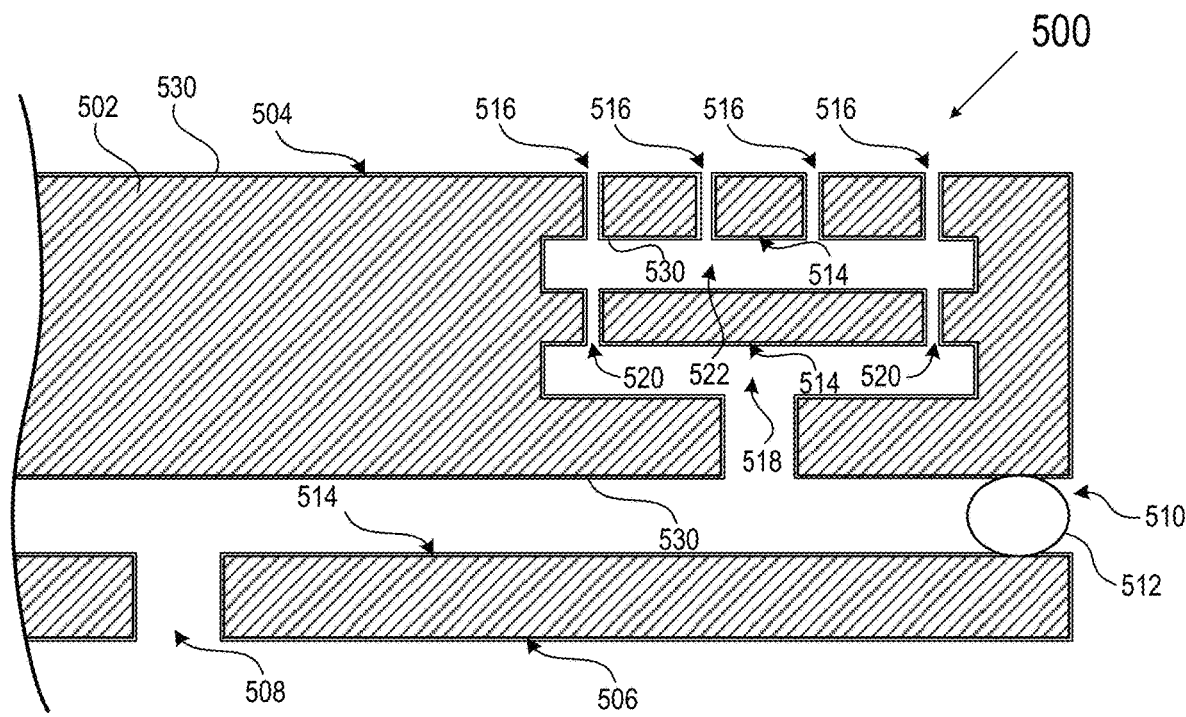
FIG. 5 illustrates a cross sectional side view of an exemplary component having internal channels formed therein in accordance with embodiments.

FIG. 5 illustrates a cross sectional side view of an exemplary component 500 having internal channels formed therein in accordance with embodiments. The component 500 is representative of an upper surface of a susceptor, a heater, or an electrostatic chuck, as described previously. For example, the component 500 may be a susceptor, which may have an overall diameter of 1 meter. It is to be understood that the features of the component 500 are not drawn to scale, and are intended to merely illustrate the internal channels of the component 500 and their connectivity.

In some embodiments, a body 502 of the component 500 may be formed from one or more materials. In some embodiments, the body 502 may be formed from a single material, such as graphite, aluminum oxide, silicon carbide, or a metal oxide (such as a ceramic or rare earth metal-containing ceramic).

The component 500 includes a plurality of channels formed therein for gas flow, which may be used for producing a vacuum or for distributing gas. The channels include a central opening 508 that passes through a lower surface 506 of the component 500, a main opening 510 that intersects the central opening 508, a first cavity 518, a second cavity 522, cavity conduits 520 that connect the first cavity 518 to the second cavity 522, and chucking holes 516 along an upper surface 504 of the component 500. In some embodiments, portions of the component 500 may be separately produced and bonded together in order to define the interior channels.

The main opening 510 provides a gas flow path between the central opening 508 and the other channels, including other channels not shown that may be formed within the component 500. In some embodiments, the main opening 510 passes at least partially through or entirely through the component 500. The main opening 510 may be formed, for example, using a gun drill. A plug 512 is included to seal the ends of the main opening 510.

A depth of the main opening 510 may range, for example, from about 0.3 meters to about 0.8 meters, and may be about 0.5 meters in some embodiments. A diameter of the main opening 510 may range from about 3 mm to about 10 mm, and may be about 6 mm in some embodiments. In some embodiments, an aspect ratio (depth:diameter) of the main opening 510 may range from 250:1 to 30:1, or any ranges therebetween for which the first number is an integer and the second number is 1 (e.g., 200:1 to 40:1, 100:1 to 70:1, etc.).

A depth of the central opening 508 from the lower surface 506 to the inner interior surface 514 may range, for example, from about 15 mm to about 22 mm, and may be about 18 mm in certain embodiments. A diameter of the central opening 508 may range, for example, from about 2 mm to 5 mm, and may be about 3 mm in certain embodiments. In certain embodiments, an aspect ratio of the central opening may range from 22:1 to 4:1, or any ranges therebetween for which the first number is an integer and the second number is 1 (e.g., 18:1 to 6:1, 10:1 to 5:1, etc.).

In some embodiments, the first cavity 518 and the second cavity 522 are connected by cavity conduits 520, which are distributed in a way to allow for consistent gas flow through the chucking holes 516. In some embodiments, the chucking holes 516 may be used to provide vacuum for securing a wafer to the upper surface 504 of the component 500. In some embodiments, a length of each of the first cavity 518 or the second cavity 522 may range from about 50 mm to about 100 mm, and may be about 75 mm in certain embodiments. A diameter of each of the first cavity 518 or the second cavity 522 may range, for example, from about 2 mm to 6 mm, and may be about 3 mm in certain embodiments. In certain embodiments, an aspect ratio of the central opening may range from 50:1 to 8:1, or any ranges therebetween for which the first number is an integer and the second number is 1 (e.g., 50:1 to 10:1, 30:1 to 20:1, etc.). In some embodiments, the diameters of the chucking holes 516 and the cavity conduits 520 may each range from about 0.5 mm to about 3 mm, from about 0.5 mm to 1 mm, from about 1 mm to about 3 mm, or from about 1 mm to about 1.5 mm.

During use in a plasma process, the component 500 will be exposed to a plasma for which a plasma resistant coating (e.g., a ceramic coating as described herein) is beneficial. Since the interior channels of the component 500 are also likely to be exposed to plasma, it is beneficial to coat their interior surfaces 514. For example, a coating 530 is illustrated as coating the upper surface 504 and the lower surface 506 of the component 500. In order to coat the interior surfaces 514 which are inaccessible to line-of-sight deposition processes, the coating 530 may be deposited using an ALD process, as described herein.

Figure 6A:
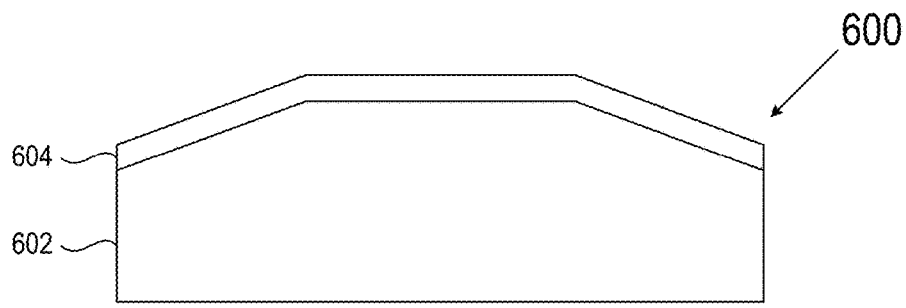
FIG. 6A illustrates a cross sectional view of a surface of a component having a single layer formed thereon in accordance with embodiments.
Figure 6B:
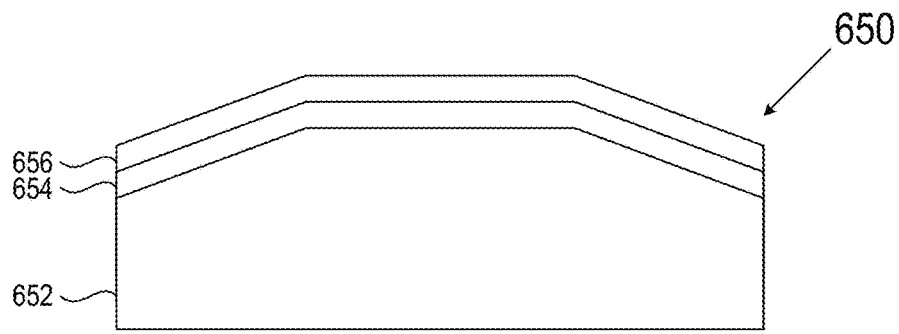
FIG. 6B illustrates a cross sectional view of a surface of a component having multiple layers formed thereon in accordance with embodiments.

FIG. 6A illustrates a cross sectional view of a coated article 600 having a single coating 604 coated onto an article 602. Similarly, FIG. 6B illustrates a cross sectional view of a coated article 650 having multiple layers coated onto an article 652. The articles 602 and 652 may be representative of any of the articles/components described herein, and may be formed from a suitable material such as AlN, $Al_2O_3$, graphite, or a rare earth metal-containing ceramic.

The coating 604 may be an ALD coating comprising any of the rare earth metal-containing ceramics discussed herein. For example, the coating 604 may be an ALD $Y_2O_3$ coating, and the article 602 may be formed from AlN.

The coatings 654 and 656 may be formed from the same or different materials. In some embodiments, one or more of the coatings 654 and 656 may comprise a rare earth metal-containing ceramic. In some embodiments, additional coatings may be formed. In some embodiments, the coating 654 may be an adhesion layer that promotes adhesion between the article 652 and the coating 656. For example, the coating 654 may be a CVD carbon bonding layer comprising amorphous carbon formed by CVD, the coating 656 may be an ALD $Y_2O_3$ coating or another ALD rare earth oxide coating, and the article 652 may be formed from graphite (e.g., crystalline or semi-crystalline graphite). The carbon bonding layer may be a pyrolytic carbon bonding layer, which may promote bonding of the ALD rare earth oxide coating. As another example, the coating 654 may be an ALD $Al_2O_3$ coating, the coating 656 may be an ALD $Y_2O_3$ coating, and the article 652 may be formed from AlN.

In some embodiments, each of the articles 602 and 652 may have different CTEs than their respective coatings. The greater the mismatch in the CTE between two adjacent materials, the greater the likelihood that one of those materials will eventually crack, peel away, or otherwise lose its bond to the other material. In some embodiments, the coating 604, for example, may be formed in such a way to minimize the CTE mismatch between the coating 604 and the article 602 such that a difference between the two CTEs is within 10% of that of the article 602. This may be achieved by varying a ratio of rare earth metal-containing compounds present in the coating 604, as will be discussed in more detail with regard to FIG. 7.

Figure 7:
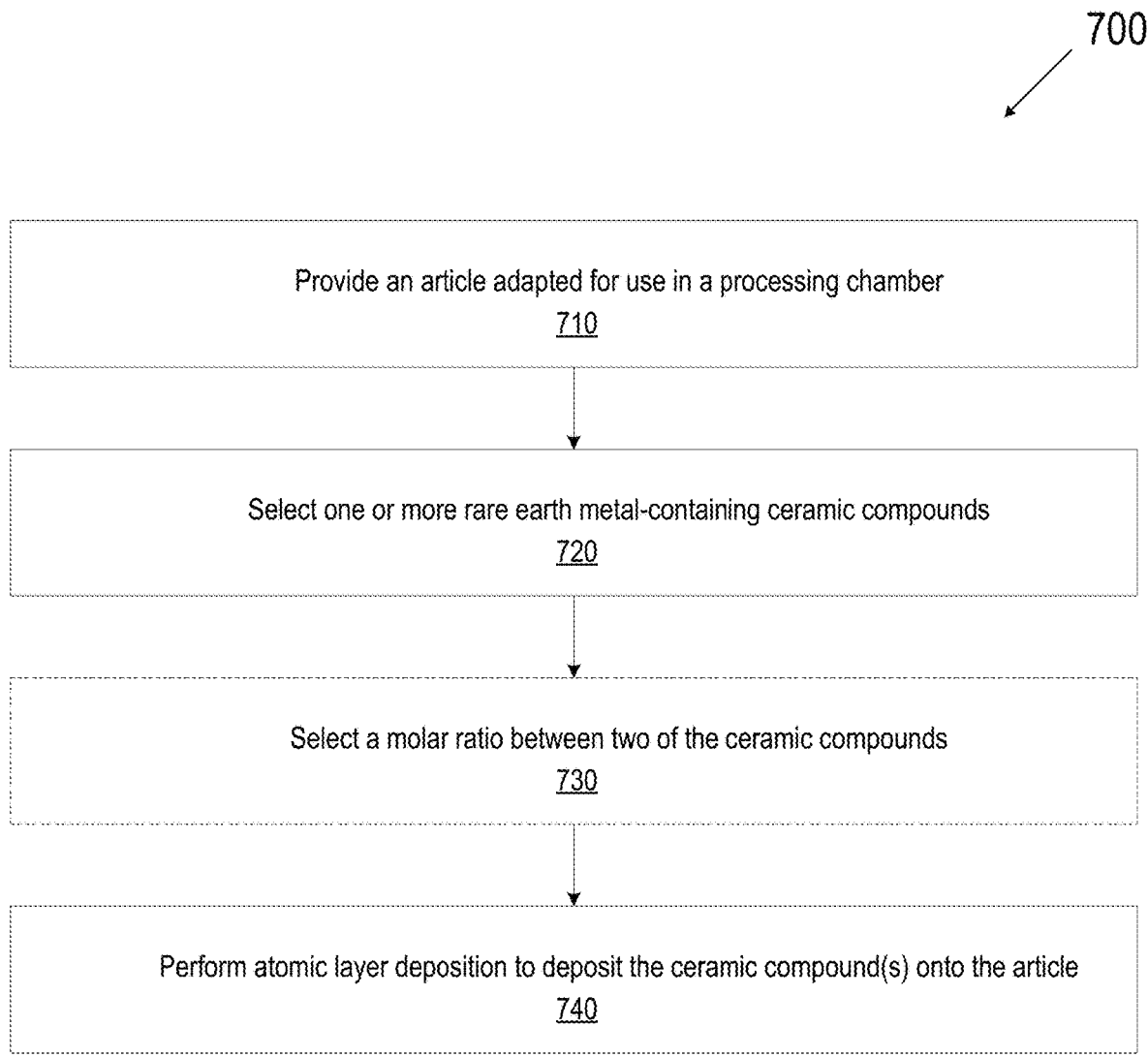
FIG. 7 illustrates a method for forming a ceramic coating using atomic layer deposition in accordance with embodiments.

FIG. 7 illustrates a method 700 for forming a ceramic coating using atomic layer deposition in accordance with embodiments. Method 700 may be used to coat any articles/components described herein.

The method 700 begins at block 710, where an article is provided. The article may be any of the articles/components described herein, such as a high temperature heater, electrostatic chuck, susceptor, etc. The article may be formed from one or more materials, such as AlN, $Al_2O_3$, graphite, etc. The article may be, for example, a component represented as the article 210 of FIGS. 2A-2C. In one embodiment, the article may be a heater, an electrostatic chuck, a nozzle, a gas distribution plate, a showerhead, an electrostatic chuck component, a chamber wall, a liner, a liner kit, a gas line, a lid, a chamber lid, a nozzle, a single ring, a processing kit ring, a base, a shield, a plasma screen, a flow equalizer, a cooling base, a chamber viewport, a bellow, a faceplate, or a selectivity modulating device. In another embodiment, the article is a high temperature susceptor (e.g., as represented by the susceptor 300 of FIG. 3). In another embodiment, the article is a high temperature heater (e.g., as represented by the heater assembly 400 of FIG. 4). In another embodiment, the article is an electrostatic chuck (e.g., as represented by the ESC assembly 150 of FIG. 1).

At block 720, one or more rare earth metal-containing ceramic compounds is selected. The ceramic compounds may include one or more of $Y_2O_3$, $Y_xZr_yO_z$, YZrOF, $Y_3Al_5O_{12}$, $Y_4Al_2O_9$, $YF_3$, $Y_xO_yF_z$, $Er_2O_3$, $Er_3Al_5O_{12}$, $ErF_3$, $ZrO_2$, $HfO_2$, $E_xO_yF_z$, $La_2O_3$, $Lu_2O_3$, $Sc_2O_3$, $ScF_3$, $Sc_xO_yF_z$, $Gd_2O_3$, $Sm_2O_3$, and $Dy_2O_3$.

At block 730, which is optional, two ceramic compounds may be selected and a molar ratio may be selected between the two ceramic compounds such that when a ceramic coating comprising the ceramic compounds in the selected molar ratio is deposited onto a surface of the article by atomic layer deposition, it results in the ceramic coating having a CTE that is within 10% of a first CTE of the article. By tuning the ratio of the ceramic compounds, it is possible to produce an ALD coating to substantially reduce or eliminate CTE mismatch between the coating and article.

The CTEs for various ceramic compounds, within the range of 40° C. to 400° C., are as follows: $7.2 \times 10^{-6}/°$ C. for $Y_2O_3$; $10.5 \times 10^{-6}/°$ C. for $ZrO_2$; $7.2 \times 10^{-6}/°$ C. for $Al_2O_3$; $4.6 \times 10^{-6}/°$ C. for AlN; $4 \times 10^{-6}/°$ C. for SiC; $2.8 \times 10^{-6}/°$ C. for SiN, $12.6 \times 10^{-6}/°$ C. for $La_2O_3$; and $6 \times 10^{-6}/°$ C. for $Er_2O_3$. The tuning of a coating comprising two compounds at different ratios may be computed as a linear combination of the CTEs of the compounds, $CTE_{coating} = R_A CTE_A + R_B CTE_B$, where R is the mol % of a particular compound. For example, a 3:1 molar ratio of $Y_2O_3$ to $ZrO_2$ would be calculated as $0.66*7.2 + 0.33*10.5 = 8.2 \times 10^{-6}/°$ C.

In some embodiments, a first ceramic compound comprises a rare earth oxide, and the second ceramic compound comprises a rare earth oxyfluoride or a rare earth fluoride. In some embodiments, the first ceramic compound comprises $Y_2O_3$, and the second ceramic compound comprises $Y_xO_yF_z$.

At block 740, ALD is performed (e.g., as described with respect to FIGS. 2A-2C) to deposit the ceramic compound, combination of ceramic compounds, or combination of two compounds in the selected ratio onto the article to produce the coated article. In some embodiments, additional coatings are deposited. For example, multiple layers of rare earth metal-containing compounds may be formed. In some embodiments, an adhesion layer is first deposited onto the article, which may be deposited via ALD, CVD, or other deposition method (e.g., a CVD carbon layer).

In some embodiments, the compounds are deposited via ALD in alternating layers to achieve the selected ratio. For example to achieve a 3:1 ratio of $Y_2O_3$ to $ZrO_2$, three depositions of $Y_2O_3$ followed one deposition of $ZrO_2$ is performed in an alternating fashion to achieve a desired thickness. In some embodiments, the compounds are co-deposited or deposited by co-dosing precursors of the compounds (e.g., using a mixture of a first metal-containing precursor and a second metal-containing precursor).

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing the method 700 described above.

The coated article may further comprise a ceramic coating (e.g., a rare earth metal-containing coating). In one embodiment, the composition of the coating may be $Y_2O_3$, $Y_xZr_yO_z$, YZrOF, $Y_3Al_5O_{12}$, $Y_4Al_2O_9$, $ZrO_2$, $YF_3$, $Y_xO_yF_z$, $Er_2O_3$, $Er_3Al_5O_{12}$, $ErF_3$, $E_xO_yF_z$, $La_2O_3$, $Lu_2O_3$, $Sc_2O_3$, $ScF_3$, $Sc_xO_yF_z$, $Gd_2O_3$, $GdF_3$, $Gd_xO_yF_z$, $Sm_2O_3$, $Dy_2O_3$, or a combination thereof. In one embodiment, the coating may be deposited using ALD (e.g., as described with respect to FIGS. 2A-2C).

The coated article may further comprise an adhesion layer between the component and the coating layer. In one embodiment, the adhesion layer is an amorphous carbon layer.

In one exemplary embodiment, a 2 μm-thick ALD coating of polycrystalline $Y_2O_3$ is formed on an AlN substrate.

In another exemplary embodiment, a 50 nm-thick ALD coating of polycrystalline YZrO is formed on an $Al_2O_3$ substrate.

In another exemplary embodiment, a 160 nm-thick ALD coating of polycrystalline $YF_3$ is formed on an AlN substrate.

In another exemplary embodiment, an ALD coating of $Y_2O_3$, YZrO, or $YF_3$ is formed on $Al_2O_3$ buffer layer that is formed on an AlN substrate. The $Al_2O_3$ buffer layer may prevent a reaction interface layer from forming between rare earth metal-containing coating and the AlN substrate.

Figure 8:
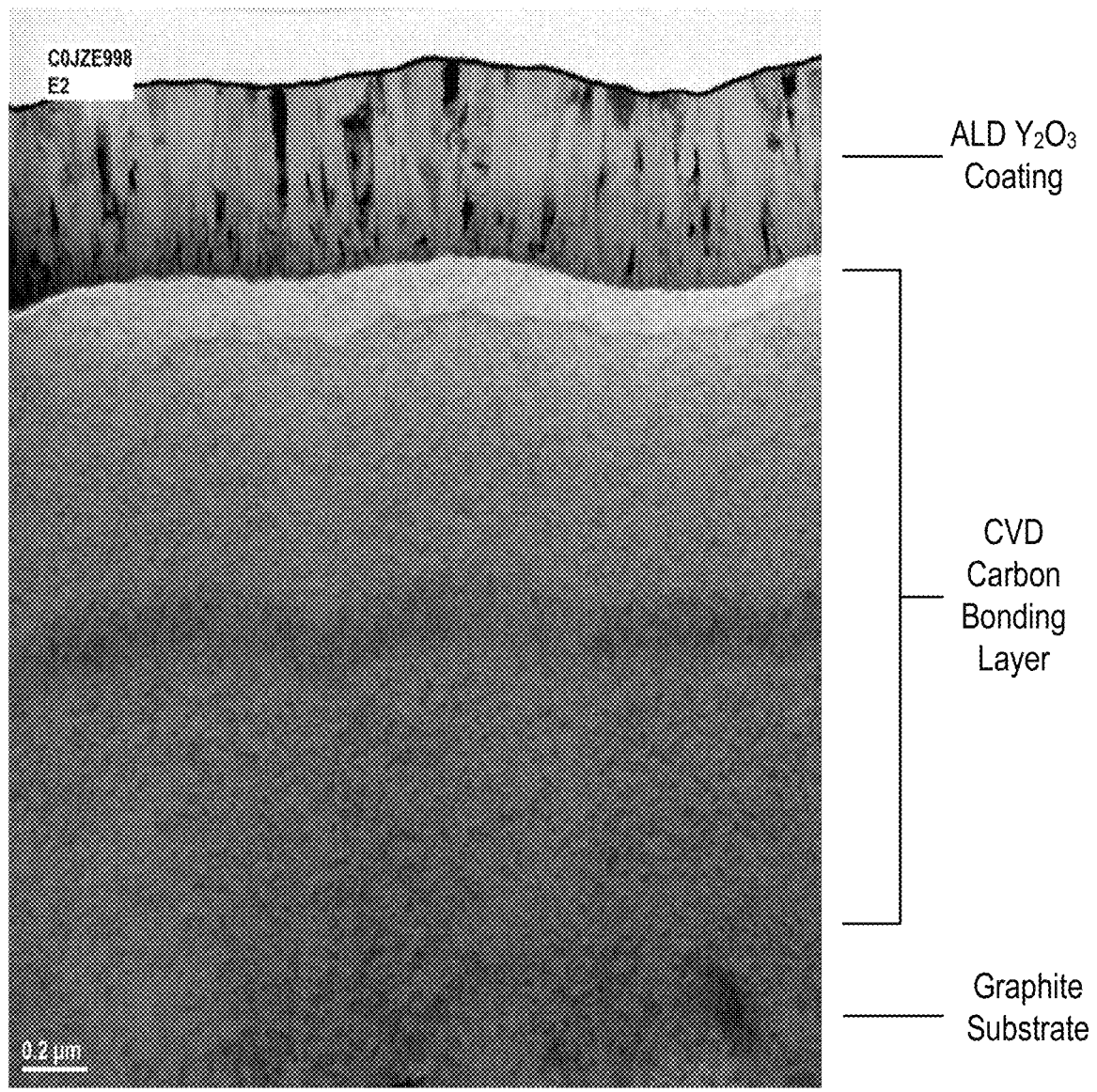
FIG. 8 is a transmission electron micrograph of a graphite substrate having an adhesive layer and a ceramic layer formed thereon in accordance with embodiments.

In another exemplary embodiment, an ALD coating of crystalline $Y_2O_3$ is formed on an adhesion layer, which is formed on a crystalline graphite substrate. The adhesion layer may be an amorphous carbon layer deposited via CVD, which promotes bonding between the crystalline graphite and the $Y_2O_3$. This exemplary embodiment is shown in FIG. 8, which shows a transmission electron micrograph of a graphite substrate having an adhesive layer and a ceramic layer formed thereon.

This particular embodiment utilizing a rare earth metal-containing ceramic conformal coating on a graphite article with a carbon layer disposed therebetween is advantageous over other types of intermediate layers, such as a SiC layer. While graphite is relatively inexpensive, has a high thermal conductivity, high thermal shock resistance, it is porous and contains impurities. Moreover, graphite is easily eroded by fluorine-based plasma, making it advantageous to coat the graphite body to fill the pores, and provide a plasma-resistant layer to prevent the impurities of graphite from contaminating processed substrates. Conformal plasma-resistant coatings, such as those described herein, are beneficial in coating a graphite articles, but can result in a poor quality coating due to the porosity and roughness of the graphite surface. By utilizing an amorphous carbon adhesion layer, which is more dense than the underlying sintered graphite substrate, allows for improved adhesion between the ceramic layer and the substrate under high temperature operations.

These aforementioned embodiments are not intended to be limiting, and other embodiments not expressly disclosed are complemented, which may be one of several combinations or permutations of the various embodiments described herein.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the embodiments of the present disclosure. Thus, the specific details set forth are merely exemplary. Particular embodiments may vary from these exemplary details and still be contemplated to be within the scope of the present disclosure.

It should be noted that different references to "an" or "one" embodiment in this disclosure are not necessarily to the same embodiment, and such references mean at least one. Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±1%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A coated article comprising:
an article adapted for use in and shaped to mechanically couple to an interior of a processing chamber, wherein the article comprises:
an exterior surface; and
an interior channel comprising an interior surface that is inaccessible to line-of-sight deposition processes, wherein the exterior surface and the interior surface correspond to surfaces that are exposed to a plasma when used in the processing chamber during a plasma process; and
a multi-layer coating formed on the exterior surface and the interior surface of the article, the multi-layer coating comprising an alternating series of at least two types of layer materials, wherein at least one of the layer materials is a rare earth metal-containing ceramic selected from a group consisting of $Y_2O_3$, $Y_xZr_yO_z$, YZrOF, $Y_3Al_5O_{12}$, $Y_4Al_2O_9$, $YF_3$, YOF, $Y_xO_yF_z$, $Er_2O_3$, $Er_3Al_5O_{12}$, $ErF_3$, $E_xO_yF_z$, $La_2O_3$, $Lu_2O_3$, $Sc_2O_3$, $ScF_3$, $Sc_xO_yF_z$, $Gd_2O_3$, $GdF_3$, $Gd_xO_yF_z$, $Sm_2O_3$, and $Dy_2O_3$, and combinations thereof, wherein the multi-layer coating is substantially uniform, conformal, and porosity-free.

2. The coated article of claim 1, wherein an aspect ratio of the interior channel is 30:1 to 250:1.

3. The coated article of claim 1, wherein the article is a high temperature article selected from a heater, an electrostatic chuck, or a susceptor.

4. The coated article of claim 1, wherein the multi-layer coating has a thickness from about 100 nm to about 5000 nm.

5. The coated article of claim 1, wherein the article comprises a composition selected from a group consisting of: AN, $Al_2O_3$, and graphite.

6. The coated article of claim 1, further comprising:
an adhesion layer disposed between the multi-layer coating and the interior and exterior surfaces of the article.

7. The coated article of claim 1, wherein a coefficient of thermal expansion of the multi-layer coating is within 10% of a coefficient of thermal expansion of the article.

* * * * *